United States Patent
Mase et al.

(10) Patent No.: US 8,523,632 B2
(45) Date of Patent: Sep. 3, 2013

(54) BLASTING METHOD AND APPARATUS HAVING ABRASIVE RECOVERY SYSTEM, PROCESSING METHOD OF THIN-FILM SOLAR CELL PANEL, AND THIN-FILM SOLAR CELL PANEL PROCESSED BY THE METHOD

(75) Inventors: Keiji Mase, Tokyo (JP); Katsuyuki Sakuma, Tokyo (JP); Shigeru Fujinori, Tokyo (JP)

(73) Assignee: Fuji Manufacturing Co., Ltd., Tokyo (JP)

( * ) Notice: Subject to any disclaimer, the term of this patent is extended or adjusted under 35 U.S.C. 154(b) by 974 days.

(21) Appl. No.: 12/611,230

(22) Filed: Nov. 3, 2009

(65) Prior Publication Data

US 2010/0122719 A1    May 20, 2010

(30) Foreign Application Priority Data

Nov. 20, 2008    (JP) .................................. 2008-297238

(51) Int. Cl.
*B24C 1/00*    (2006.01)
(52) U.S. Cl.
USPC .................... 451/38; 451/87; 451/70; 451/88
(58) Field of Classification Search
USPC .................................... 451/37–40, 87, 88, 70
See application file for complete search history.

(56) References Cited

U.S. PATENT DOCUMENTS

| | | | | |
|---|---|---|---|---|
| 2,628,456 A | * | 2/1953 | Berg .............................. | 451/87 |
| 5,364,472 A | * | 11/1994 | Heyns et al. ...................... | 134/7 |
| 5,571,335 A | * | 11/1996 | Lloyd ............................... | 134/1 |
| 5,928,434 A | * | 7/1999 | Goenka ............................. | 134/2 |

(Continued)

FOREIGN PATENT DOCUMENTS

| | | |
|---|---|---|
| JP | 08257913 | 3/1995 |
| JP | 9300220 A | 11/1997 |

(Continued)

OTHER PUBLICATIONS

Office Action dated Jul. 5, 2012, from corresponding Chinese Patent Application No. 200910224599.6.

*Primary Examiner* — George Nguyen
(74) *Attorney, Agent, or Firm* — Porzio, Bromberg & Newman, P.C.

(57) ABSTRACT

Particularly, a thin-film solar cell panel or the like is processed without necessity of attaching and detaching of mask and washing steps with respect to a workpiece in a fine blasting employing a fine abrasive. A negative pressure space (20) and an opposing negative pressure space (40) having openings (22, 42) are opposed by being spaced at a movement allowable interval of the workpiece such as a thin-film solar cell panel or the like and so as to face one side edge in the same direction as a moving direction of the workpiece. Then, a fine abrasive is injected from a blast gun (30) in which an injection hole (31) is disposed within the negative pressure space (20), the workpiece is relatively moved in a moving direction (T) with respect to the injection hole, and while the fine abrasive is injected, compressed gas generating a gas flow having a diffusing direction substantially parallel to the relative moving direction of the workpiece to carry out air blow, thereby the fine abrasive and a cut scrap injected from a space within each of negative pressure space through the intermediary of a suction device communicated with the negative pressure space (20) and/or the opposing negative pressure space (40).

26 Claims, 26 Drawing Sheets

(56) References Cited

U.S. PATENT DOCUMENTS

| | | | |
|---|---|---|---|
| 7,059,940 B2 * | 6/2006 | Seo et al. | 451/37 |
| 7,182,671 B1 * | 2/2007 | Shimizu et al. | 451/8 |
| 2002/0006765 A1 * | 1/2002 | Michel et al. | 451/28 |
| 2003/0134574 A1 * | 7/2003 | Uziel | 451/39 |
| 2004/0116048 A1 * | 6/2004 | Akedo | 451/38 |
| 2004/0266317 A1 * | 12/2004 | Mase et al. | 451/2 |

FOREIGN PATENT DOCUMENTS

| | | |
|---|---|---|
| JP | 2000000765 A | 7/2000 |
| JP | 2000198071 A | 7/2000 |
| JP | 2004066415 A | 8/2002 |
| JP | 2005334979 A | 12/2005 |

* cited by examiner

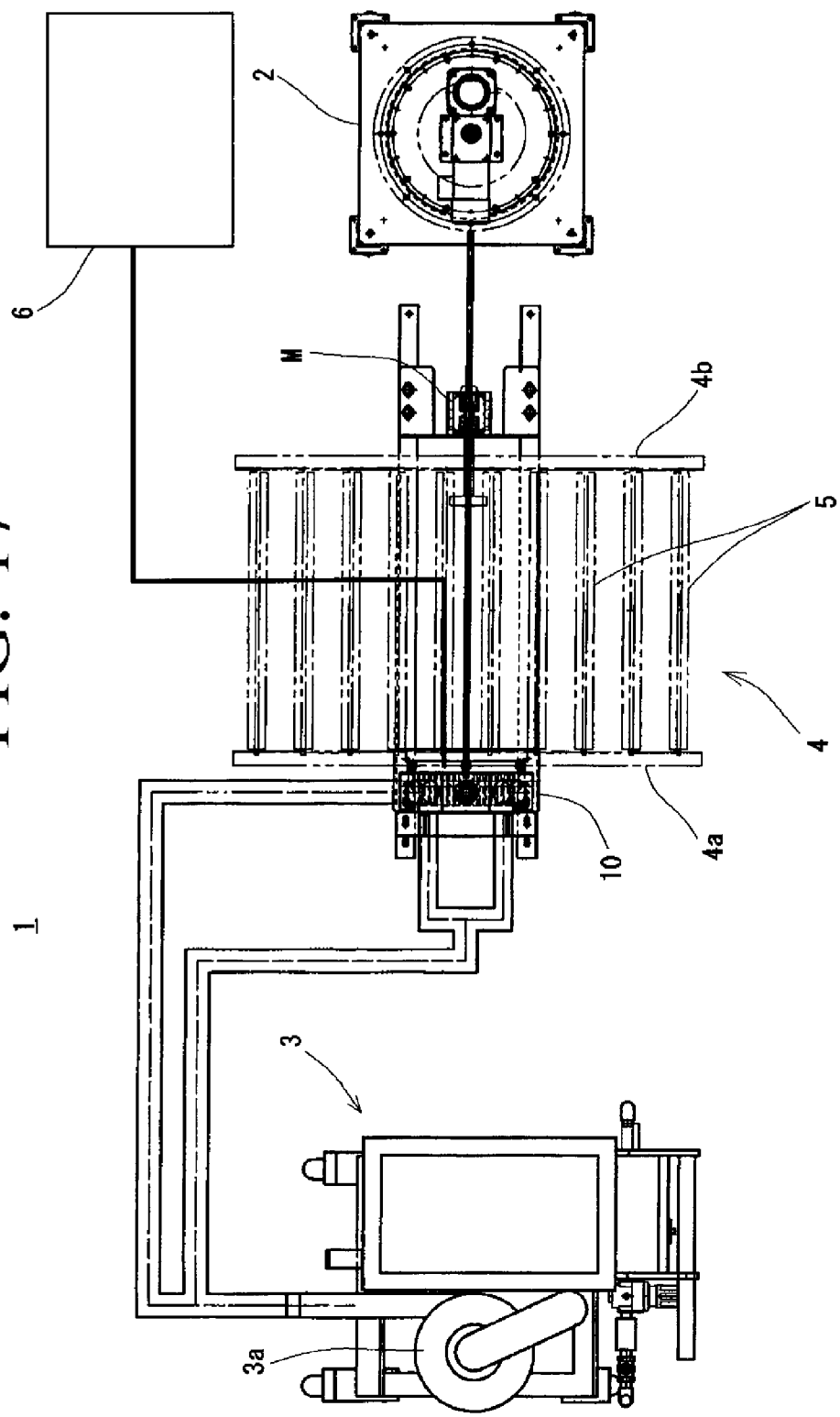

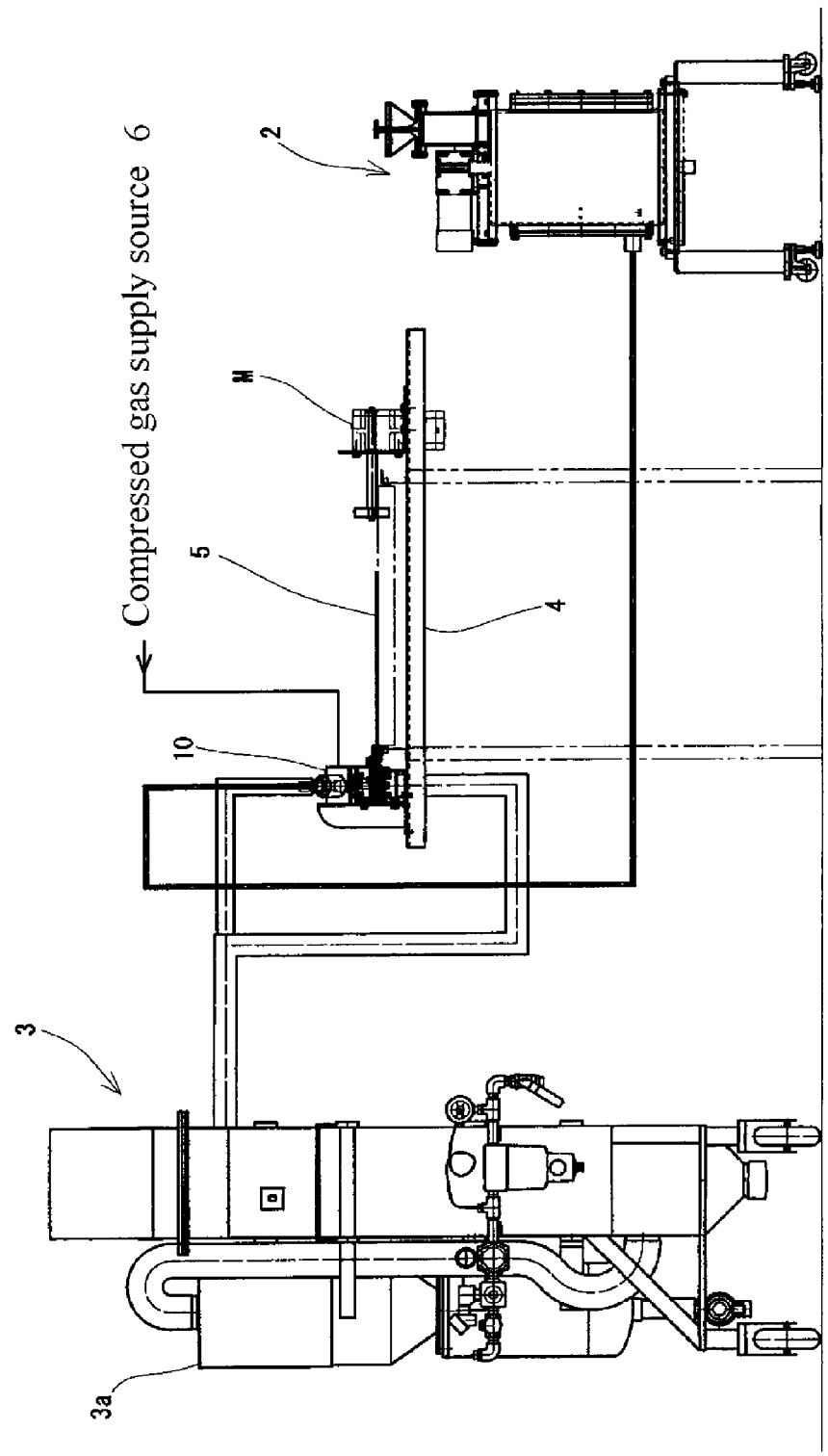

Prior Art

Prior Art

BLASTING METHOD AND APPARATUS HAVING ABRASIVE RECOVERY SYSTEM, PROCESSING METHOD OF THIN-FILM SOLAR CELL PANEL, AND THIN-FILM SOLAR CELL PANEL PROCESSED BY THE METHOD

BACKGROUND OF THE INVENTION

1. Field of the Invention

The present invention relates to a blasting method and apparatus provided with an recovery system for abrasive, and more particularly to a blasting method including a recovery method of the abrasive as a system for recovering the abrasive in the blasting and a blasting apparatus used for this processing, the blasting apparatus provided with an abrasive recovery system executing the method, a processing method of a thin-film solar cell panel, and a thin-film solar cell panel processed by the method.

In more detail, the present invention relates to a blasting method and a blast processing apparatus (hereinafter, referred to as "blasting apparatus") which can prevent a fine abrasive and a cut scrap including a crushed abrasive by the blasting process from being attached to an article to be processed (hereinafter, referred to as "workpiece"), which is preferably adapted to a so-called blasting using the fine abrasive, and a thin-film solar cell panel relating to the processing method.

In the present invention, a concept of the fine abrasive includes a coarse particle as well as the fine particle. In JISR6001, a particle size distribution of the coarse particle is defined, and the particle size distribution up to the particle size F60 (indicated so in JIS) can be used. A typical particle size in F60 is 230 µm, however, hereinafter, the fine particle means a particle of #400 or more, or a particle with an average particle diameter 30 µm or less.

2. Description of the Related Art

As an example of the blasting apparatus, there is experimentally referred to a gravity type blasting apparatus 60 which has not been conventionally employed, and a description will be given of it with reference to FIG. 20. The blasting apparatus 60 is provided with a cabinet 61 forming a processing chamber inside thereof, for processing the workpiece (not shown) carried in the cabinet 61 through the intermediary of a carry-in port 63 by disposing an injection nozzle 62 within the cabinet 61.

In general, a recovery cycle of the abrasive in the blasting apparatus is configured as follows. That is, a lower portion of the cabinet 61 is formed into an inverse pyramid shape, a hopper 68 is formed at the lower portion, and a lowest end of the hopper 68 is communicated with an upper portion of a recovery tank 70 for recovering the abrasive, installed at an upper portion of the cabinet 61 through the intermediary of a conduit 65.

Further, the recovery tank 70 mentioned above is a so-called cyclone for separating the cut scrap from the abrasive. If a leading end of the conduit 65 is connected to an inflow port 73 of the recovery tank 70 through the intermediary of a communication pipe 75, and an inside of the recovery tank 70 is sucked by a dust collector (not shown) provided with a wind discharging machine through the intermediary of a connecting pipe 74 and a discharge pipe 67, the abrasive and the cut scrap within the cabinet has been transferred into the recovery tank 70 together with an air current through the intermediary of the communication pipe 75, the cut scrap is recovered by the dust collector at a time of falling down while turning along an inner wall of the recovery tank 70, and the reusable abrasive is collected in a bottom portion of the recovery tank 70 and pressure-fed to the injection nozzle 62 through the intermediary of an abrasive feeding pipe 64.

As mentioned above, the reusable abrasive can be injected by the injection nozzle together with the newly charged abrasive as occasion demands.

Thereafter, the recovering cycle mentioned above is repeated.

As mentioned above, in the conventional blasting apparatus 60, the abrasive injected within the processing chamber is fed into the recovery tank 70 by a negative pressure generated by the dust collector, then recovered. However, in the case of using the fine particle having a small particle diameter, since a surface area of each fine abrasive is larger with respect to its weight in comparison with a general abrasive, the fine abrasive has a property tending to firmly attaching or agglutinating to the workpiece or the like. Accordingly, once the fine abrasive is attached to the workpiece and the inner wall of the processing chamber, it is hard to remove it even if an inside of the processing chamber is sucked by the negative pressure or an air blowing or the like is applied to the workpiece.

Accordingly, the workpiece to which the blasting is applied by such fine abrasive requires a step for removing the fine abrasive attached to a surface thereof by cleaning it with a washing water after the blasting.

As mentioned above, in the blasting using the fine abrasive, taking into consideration the fact that once the fine abrasive is attached to the workpiece or the like, it is hard to remove it, there has been proposed to recover the fine abrasive before it is attached to the workpiece or the other places.

As one example of such structure, in a blasting apparatus 80 shown in FIG. 21, it has been proposed that one end of a processing duct 81 is provided with an injection nozzle 91 injecting an abrasive, the other end of the processing duct 81 is communicated with a suction duct 83 sucking an abrasive by a negative pressure, the processing duct 81 is provided with a blast chamber 82 in a front side of an injection current of the abrasive, a side wall of the blast chamber 82 is provided with an insertion port 84 inserting a workpiece W in a direction which is approximately orthogonal to the injection current of the abrasive, and an intake port 85 as an intake gap for sucking an ambient air is formed between an inner periphery of the insertion port 84 and an outer periphery of the workpiece W, whereby the fine abrasive injected to the workpiece in the blast chamber is immediately sucked from the suction duct, and the abrasive is prevented from scattering to the processing chamber by an air blow generated by the ambient air sucked from the intake gap (see Japanese Patent LOPI No. H09-300220).

In this case, since the blasting using the fine abrasive can be carried out at a high precision, it can be expected to be utilized in various fields. As one example, there can be considered a utilized field which is substitute for the currently utilized laser processing in a scribing (a fluting) carried out in a manufacturing step of a thin-film solar cell panel.

In a scene of which the scribing carried out in the manufacturing step of the thin-film solar cell panel is carried out by the laser, as shown in FIGS. 22A and 22B, it is required a step for removing a thin film layer from a glass substrate in a range of width within several mm to ten and several mm in a peripheral edge portion, before attaching a glass cover after forming thin film layers such as a back electrode, a light absorbing layer, an emitter, a transparent electrode and the like which are required for the thin-film solar cell, on the glass substrate. Therefore, even in the case that a metal frame made of aluminum or the like is attached to the peripheral edge portion after attaching the glass cover, it is possible to prevent a short circuit between the metal frame and the peripheral edge by removing the thin film layer at the peripheral edge portion as mentioned above.

In this case, the scribing by means of the laser carried out in the manufacturing step of the thin-film solar cell panel is also carried out in the case of dividing the thin-film solar cell panel into each of the cells as well as the example mentioned above.

The scribing carried out in the manufacturing step of the thin-film solar cell panel is generally carried out by the laser at the present, however, the laser processing apparatus mentioned above is expensive, a lot of initial investment is necessary, and a comparatively high running cost is required because a nitrogen gas is consumed in a nitrogen gas laser which is generally used for this kind of work.

Accordingly, if the scribing mentioned above can be carried out by a blasting apparatus which is inexpensive in comparison with the laser apparatus and a method called as a blasting which can comparatively hold down the running cost, it is advantageous in a cost competitive power in a market.

However, in the case that the scribing mentioned above is carried out by the blasting using the fine abrasive, since the injected abrasive is attached to the workpiece, it is necessary to remove the abrasive attached as mentioned above, however, the fine abrasive is hard to be removed once it is attached to the workpiece, as mentioned above, and can not be easily removed by sucking the processing chamber by means of the dust collector or applying the air blow to the workpiece.

Accordingly, if the fine abrasive attached to the workpiece as mentioned above is going to be removed, it is required to wash the workpiece with water or the like after the blasting, however, in the case that the workpiece is the thin-film solar cell panel mentioned above, it is impossible to wash it with the washing water, and there has been no effective means for removing the fine abrasive attached therewith.

Further, in the case of carrying out the cut by the blasting apparatus, since the abrasive injected by a blast gun to a surface of the workpiece in an orthogonal direction then bombarded onto the surface of the workpiece is diffused to all the directions, such as, 360 degree along a surface of the workpiece together with the air current feeding the abrasive as shown in FIG. 23, the workpiece is cut not only in a surface on which bombarded with the abrasive but also in the periphery.

Accordingly, if the scribing as mentioned above is going to be carried out by the blasting, it is necessary to previously protect the surface of a non-cut portion by sticking the mask material on the surface in such a manner that the surface to be left without being removed is not cut.

However, in the case that the thin-film solar cell panel mentioned above is employed as the workpiece, each of the layers formed on the glass substrate is comparatively brittle, and there is a risk that the thin film layer is peeled off from the glass substrate due to a shock at a time of sticking and peeling a mask material, when it is stuck or peeled off after processed.

As mentioned above, in the blasting using the fine abrasive, since the abrasive is firmly attached to the workpiece so as to be hard to be removed, and it is necessary to stick the mask material for defining the cut range, the blasting can not be applied to the workpiece which can neither washed nor stuck by the mask material such as the thin-film solar cell panel, in spite that it is excellent in terms of the cost in comparison with the scribing by the laser.

In this case, in the apparatus brought on as '300220 mentioned above, it is intended to recover the fine abrasive before it is attached to the workpiece, however, the workpiece which is applicable here is limited to a cylindrical-shaped workpiece or a linear workpiece, on the basis of a structure shown in FIG. 21, and can not be applied, for example, to a plate-like two-dimensional workpiece vertically separates the processing chamber into two.

Further, in the structure described in '300220 mentioned above, it is essential to stick the mask material if it is intended to form a groove having a fixed width with respect to the workpiece, and it is impossible to use for the scribing of the thin-film solar cell panel in this regard.

In this case, in the present specification, a description will be given by exemplifying the thin-film solar cell panel formed into the plate-like two-dimensional shape as one example of the workpiece, however, the same problem mentioned above is generated even in the workpiece made of various materials which can neither be washed with the washing water nor be stuck by the mask material, without being limited thereto.

Further, even in the workpiece which can be washed and stuck by the mask material, there is an advantage that productivity is improved and a working cost can be reduced as far as it is possible to omit the washing and the sticking of the mask.

As the foregoing, there is a serious defect that the abrasive or the like can not be peeled off and fallen away by an after blow and a water washing is required once the abrasive or the like is attached to a surface to be processed of the workpiece W in the related art mentioned above. Accordingly, an object of the present invention is to overcome the above disadvantage in providing a blasting method and a blasting apparatus including an abrasive recovery system which can easily recover the abrasive or the like before being attached to the workpiece even in the case of using the fine abrasive, accordingly can make the step of the (water) washing or the like for removing the fine abrasive after the blasting unnecessary without generating the attachment thereof, and can carry out a fluting or the like at a fixed cut width without sticking a mask material to the workpiece which is moved relatively.

SUMMARY OF THE INVENTION

The present invention can be more effectively used in the case of carrying out a cutting process at a predetermined width to a workpiece, particularly formed into a plate-like two-dimensional shape, without being limited thereto, and can be utilized as a substitute for a laser used for various etching and processing, for example, scribing a thin-film solar cell panel which has been conventionally carried out by the laser because it is unnecessary to carry out a step of sticking a mask material for limiting a cut range, washing by means of a washing liquid for removing the attached fine abrasive or the like.

Basic structure, operation and effect of the present invention will be apparent from the following description.

In order to achieve the object mentioned above, a blasting method according to the present invention comprises the steps of:

sucking a space on a workpiece to be processed through the intermediary of a suction device communicating with the space to make the space as a negative pressure space;

relatively moving the workpiece in an atmosphere with respect to an injection hole of a blast gun disposed within the negative pressure space opposed to a surface to be processed of the workpiece being provided each other at a predetermined distance; and preferably, injecting a mixed fluid of a compressed gas and an abrasive to the surface to be processed of the workpiece from an opening in which a longitudinal direction is positioned at the same direction of the moving direction of the workpiece in the negative pressure space and said opening being formed in the negative pressure space and faced to at least one side edge of the workpiece.

Furthermore, the present invention is characterized by comprising a recovery system, wherein compressed gas generating a gas flow having a diffusing direction substantially parallel to the relative moving direction of the workpiece with respect to the injection hole of the blast gun is injected from a blow nozzle at an appropriate injection time or injection quantity, from a blow nozzle, during when the mixed fluid is injected to the surface to be processed of the workpiece;

an inductive gas flow diffusing substantially parallel (a horizontal direction in FIG. 19) to the relative moving direction of the workpiece is generated by the gas as shown in FIG. 19; and a cut scrap and the abrasive are sucked and recovered through the intermediary of the suction device from an upstream of the diffusing direction of the inductive gas flow extending to a left or right of FIG. 19, that is, a direction of down stream which is not a side of the injection hole of the blast gun or of the blow nozzle, in other word, from at least one of a front side of the diffusing direction.

According to the above construction, it is possible to prevent the abrasive injected from the blast gun 30 from being diffused to a side of the inductive gas flow, and induce the abrasive to a front side and/or a back side of the moving direction T of the workpiece W by injecting a compressed gas from the blow nozzle 32 to generate the inductive gas flow having the diffusing direction substantially parallel to the moving direction T of the workpiece W at a side of the injection hole 31 of the blast gun 30 (See FIG. 16).

As a result, it is possible to align the diffusing direction of the abrasive and the suction recovery direction by a pair of the suction devices 21a, 21b provided at the front side of the diffusion direction in the apparatus by sucking the negative pressure space 20a (, 20b) from the front side of the diffusion direction of the inductive gas flow through the intermediary of the pair of suction devices 21a, 21b, accordingly, it is possible to effectively recover the abrasive and the cut scrap in the negative pressure space 20a (, 20b).

Thereby, it is possible to recover the abrasive during when the abrasive is in a flowing state before accumulated on a surface of the workpiece W, and to securely prevent an attachment of the abrasive to the workpiece W.

Since the attachment of the abrasive to the workpiece W can be prevented as described above, a process to wash the workpiece W after blasting then remove the abrasive becomes unnecessary, and since the inductive gas flow injected from the blow nozzle 32 restrict the abrasive injected from the blast gun 30 to be diffused toward an orthogonal direction with respect to the moving direction T of the workpiece W, a fluting at a fixed cut width can be carried out without sticking a mask material.

As a result, even if the workpiece W to be processed has such a property as the thin-film solar cell panel or the like on which washing can not be conducted and to which the mask material can not be stuck, it is possible to employ a workpiece W to be processed as the subject of the blasting using the abrasive.

Further, in the method, it is preferable that a space below the workpiece is sucked at an opposite side to the surface to be processed of the workpiece opposed to the negative pressure space through the intermediary of a suction device communicating with the space below the workpiece to make the space as an opposing negative pressure space, and a cut scrap and an abrasive are sucked and recovered from the negative pressure space and/or the opposing negative pressure space through the intermediary of the suction device of the opposing negative pressure space from a recovery opening which is not covered by the workpiece, among the openings of the opposing negative pressure space and/or of the negative pressure space.

In a construction of which the opposing negative pressure space 40 arranged to be opposed to the negative pressure spaces 20a, 20b is formed, in a case of which a fluting is carried out to one side of the plate-like two-dimensional workpiece W as shown in FIGS. 1, 2, for example, the abrasive and/or the cut scrap in the negative pressure space 20a (20b) can be recovered even from the opposing negative pressure space 40 (through the intermediary of an interval p between an insertion regulating body 51 and one side of the workpiece W in the example shown in FIG. 5). Therefore, it is possible to preferably prevent the abrasive from being remained in the negative pressure space 20a (20b) and attached to the workpiece W and/or an inside of the negative pressure space 20a (20b).

Moreover, the abrasive injected from the blast gun 30 can be promptly recovered in a state that the workpiece W is not existed between the negative pressure spaces 20a, 20b and the opposing negative pressure space 40, for example, before the insertion of the workpiece W or after the passage of the workpiece W, thereby it is possible to keep an arranged position of the workpiece W clean, accordingly it is possible to preferably prevent a secondary contamination generated by attaching the abrasive which remains in the arranged position of the workpiece W to the workpiece W.

Further, insides of the negative pressure spaces 20a, 20b and the opposing negative pressure space 40 are sucked then the suction force applied to the workpiece W caused by the suction within the negative pressure spaces 20a, 20b is suppressed by the suction force applied to the workpiece W caused by the suction within the opposing negative pressure space 40, thereby the workpiece W is relatively moved smoothly.

Preferably, a rectifying plate 24 may be provided within the opening 22 of the negative pressure spaces 20a, 20b at both sides of the injection hole 31 and inclined so as to put distance from the workpiece W as far from the injection hole 31 in its width direction, thereby the rectifying plate 24 separate a flow of the abrasive flowing along the surface of the workpiece W from the surface of the workpiece W, then deflect the flow of the abrasive to a direction of the suction devices 21a, 21b in the negative pressure spaces 20a, 20b.

In a construction of which the rectifying plate 24 mentioned above is provided within the opening 22 of the negative pressure space 20a (, 20b), the rectifying plate 24 allows the flow of the abrasive which is going to flow along the surface of the workpiece W to deflect to a direction moving away upward from the surface of the workpiece W, whereby the abrasive and a cut scrap are recovered with being rode on the induction gas flow in the negative pressure space by the suction devices 21a, 21b. As a result, a recovery efficiency is improved and attachment of the fine abrasive to the workpiece W can be prevented.

Further, a blasting apparatus provided with a recovery system structure serving as an abrasive recovery system for achieving the method mentioned above comprises:

an opposing space defined by being spaced at a movement allowable interval of a workpiece W to be processed;

a blast gun 30 within the space, the blast gun 30 having an injection hole 31 opposed to the surface to be processed of said workpiece, and the injection hole 31 being provided at a predetermined distance from the surface to be processed of said workpiece, wherein the workpiece is provided so as to be transferred, for example, by a carrier means, and relatively move with respect to the injection holes, the space has an opening 22 and suction devices 21a, 21b, the opening is formed, for example, in a rectangular shape, and positioned in a manner that a longitudinal direction thereof is the same direction as a moving direction of the workpiece, and faced to at least one side edge of said workpiece, one end of the suction device communicates with the space, and the other end of the suction device communicates with the a suction means, for example, a dust collector, and the suction device sucks the space to make the space as a negative pressure space, and a blow nozzle faced to the surface to be processed of the workpiece through the intermediary of the opening and generating inductive gas flow composed of a flow of compressed so as to make a diffusing direction substantially parallel to the moving direction of the workpiece, wherein an injection hole of the blow nozzle is arranged at least one side of an orthogonal direction to the moving direction of the workpiece with respect to the injection hole of the blast gun, and the suction device is communicated with the negative pressure space from a front side of the diffusing direction of the inductive gas flow to the leading end of the blast gun.

In the blasting apparatus having the structure mentioned above, an opposing negative pressure space 40 having an opposing suction device 41 and an opening 42 may be provided on an opposite side to the surface to be processed of the workpiece respectively so as to face to the negative pressure space 20 and the opening 22 by being spaced at the movement allowable interval of the workpiece, whereby the cut scrap and the abrasive are sucked and recovered from the negative pressure space and/or the opposing negative pressure space, by the opposing suction device.

Further, it is possible to employ the method of the present invention instead of the conventional laser processing which requires the huge initial investment and the expensive running cost, by employing a thin-film solar cell panel having thin film layers such as a back electrode, a light absorbing layer, an emitter, a transparent electrode and the like which are required for the thin-film solar cell, on the glass substrate as the subject to be processed, and sucking and recovering the thin film layer and the abrasive which are cut and removed from the glass substrate, from the negative pressure space or the opposing negative pressure space. It is possible to employ the method of the present invention instead of the conventional laser processing even in the case that the thin-film solar cell panel is divided into each of the cells.

BRIEF DESCRIPTION OF THE DRAWINGS

The objects and advantages of the invention will become apparent from the following detailed description of preferred embodiments thereof provided in connection with the accompanying drawings in which:

FIGS. 2A and 2B are explanatory views explaining a relation between an elongated rectangular injection hole provided in a blast gun and a flow of an abrasive, in the abrasive recovery system according to the present invention, in which FIG. 2A is a plan view and FIG. 2B is an observation according to a perspective view;

FIGS. 3A, 3B, 3C and 3D are explanatory views explaining a positional relationship of each of devices in the abrasive recovery system according to the present invention, in which FIG. 3A is an explanatory view explaining a disposition example of the elongated rectangular injection hole provided in the blast gun and a workpiece, FIG. 3B is an explanatory view of a disposition of an opening 22 of a negative pressure space and the workpiece in a bottom elevational view and a positional relationship of a recovery opening 22' formed thereby, FIG. 3C is an explanatory view of a disposition of an opening 42 of an opposing negative pressure space and the workpiece in a plan view and a positional relationship of a recovery opening 42' formed thereby, and FIG. 3D is a schematic front view in the abrasive recovery system according to the present invention;

FIGS. 7A and 7B are bottom views of a negative pressure space, in which
FIG. 7A shows the negative space for processing one side of the plate-like two-dimensional workpiece,
and FIG. 7B shows the negative space for processing a center of the plate-like two-dimensional workpiece
FIGS. 10A and 10B are explanatory views showing mounted states a of a leading end of a blast gun and a leading end of a blow nozzle with respect to a lower end side of a partition plate, in which
FIG. 10A shows a front view,
and FIG. 10B shows a plane view;

FIGS. 11A and 11B are explanatory views showing mounted states of a leading end of a blast gun and a leading end of a blow nozzle with respect to a lower end side of a partition plate, in which FIG. 11A shows a front view, and FIG. 11B shows a plane view;

FIGS. 12A and 12B are explanatory views showing mounted states of a leading end of a blast gun with respect to a lower end side of a partition plate, in which FIG. 12A shows an example of which a gap (between the leading end of the lower side) is generated, and FIG. 12B shows an example of which the leading end of the blast gun is flatly attached (preferable mounted state);

FIGS. 13A and 13B are explanatory views showing mounted states of a leading end of a blow nozzle with respect to a lower end side of a partition plate, in which FIG. 13A shows an example of which no interval is provided at an outer periphery of the leading end of the blow nozzle, and FIG. 13B shows an example of which an interval is provided at an outer periphery of the leading end of the blow nozzle (preferable mounted state);

FIG. 17 is a plan view showing a blasting apparatus provided with the abrasive recovery system according to the present invention;
FIG. 18 is a front view of an apparatus provided with the abrasive recovery system according to the present invention;
FIGS. 19A and 19B are explanatory views of a processed example using the abrasive recovery system according to the present invention, in which
FIG. 19A shows a processed example in which four sides of a plate-like two-dimensional workpiece can be processed,
and FIG. 19B shows a processed example in which two sides and a center of the plate-like two-dimensional workpiece can be processed;

FIGS. 22A and 22B are explanatory views of a scribing with respect to a thin-film solar cell panel, in which FIG. 22A is an explanatory view of a region where the scribing is carried out, and FIG. 22B is an explanatory view of a layer removed by the scribing.

DETAILED DESCRIPTION OF THE PREFERRED EMBODIMENTS

Figure 1:
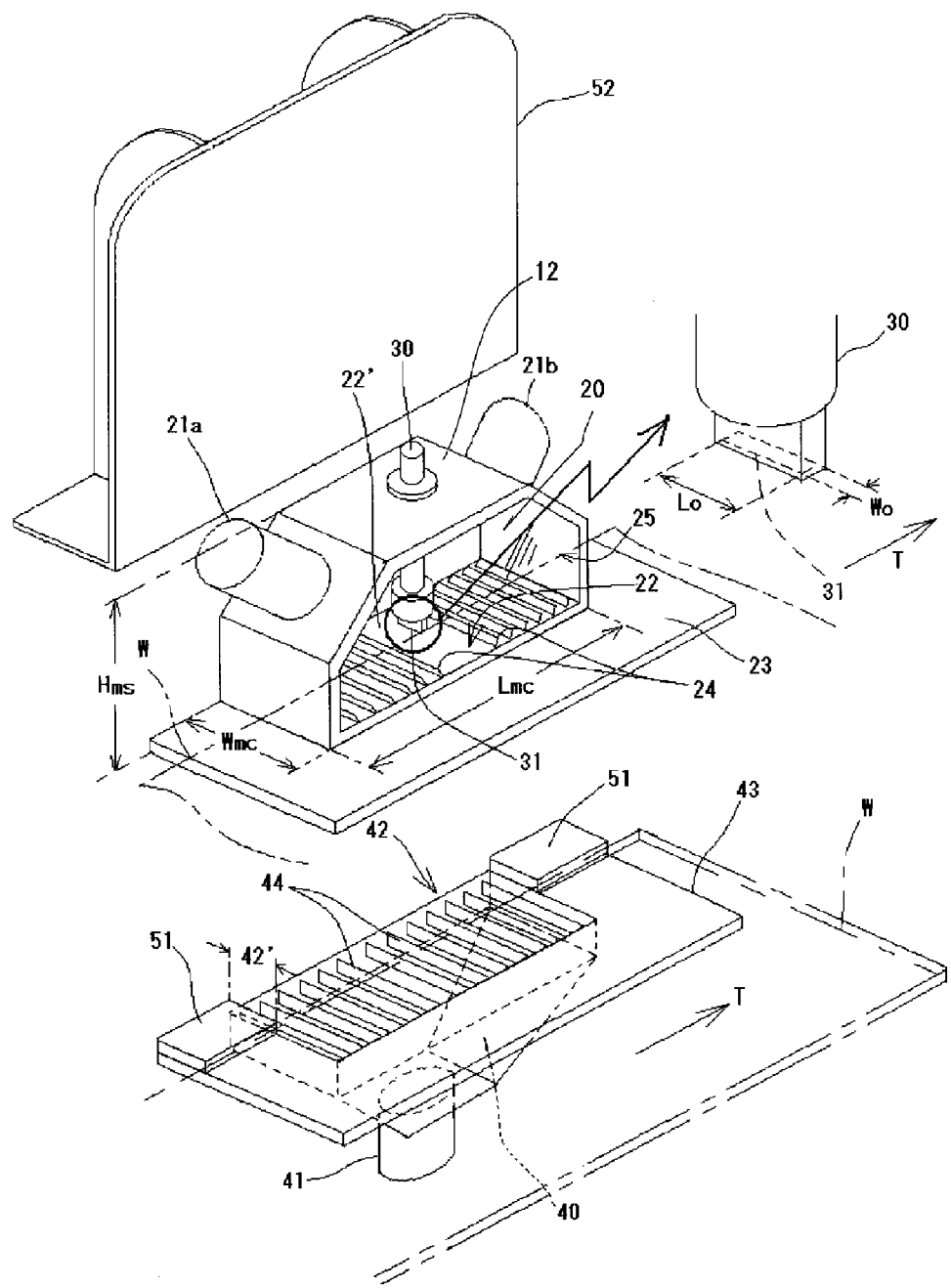
FIG. 1 is a schematic perspective view of an abrasive recovery system in a state in which a negative pressure space and an opposing negative pressure space are vertically separated in the abrasive recovery system according to a first embodiment of the present invention.

Next, an embodiment according to the first aspect of the present invention will be described with reference to the accompanying drawings.
Abrasive Recovery System Structure An embodiment of an abrasive recovery system structure (hereinafter, simply referred to as "recovery system" in the embodiment) according to the present invention used for a blasting is shown in FIGS. 1 to 3 and 17 to 19.

As shown in the drawings, the recovery system 10 according to the present invention is provided, for example, with a negative pressure space 20 opposed to a surface to be processed of a plate-like two-dimensional workpiece W being provided each other at a predetermined distance, a blast gun 30 in which an injection hole 31 is disposed within the negative pressure space 20, and suction devices 21a and 21b (hereinafter, simply referred to as "suction device 21" in the case of indicating the both) sucking an inside of the negative pressure space 20.

In the illustrated embodiment, there can be provided an opposing negative pressure space 40 opposed to an opposite surface (hereinafter, referred to as "rear face") to the surface to be processed of the workpiece W being provided each other at a predetermined distance, in addition to the negative pressure spaces 20a and 20b, the opposing negative pressure space 40 can be opposed to the negative pressure space 20 through the intermediary of the workpiece W, and there can be provided with an opposing suction device 41 sucking an inside of the opposing negative pressure space 40. However, the opposing negative pressure space 40 is not necessary to be provided and can be omitted so as to construct the recovery system 10 as is the second aspect of the present invention described below.

The negative pressure space 20 mentioned above which is opposed to the surface to be processed of the workpiece W being provided at the predetermined distance is disposed in an opposing manner so as to cover a top face of the horizontally arranged workpiece W in the illustrated embodiment, and provided with a rectangular opening 22 on an opposing surface to the workpiece W.

In the illustrated embodiment, the negative pressure space 20 is formed in a rectangular shape having a length $L_{mc}$ direction in a moving direction T of the workpiece W which is the subject to be processed in a plan view and a width $W_{mc}$ direction in an orthogonal direction to the moving direction T as shown in FIG. 1. The negative pressure space 20 includes the opening 22 at a bottom face thereof, and the opening 22 has a size in which a wall thickness is decreased from the length $L_{mc}$ and the width $W_{mc}$. In a front view that is, a horizontal cross section thereof, the negative pressure space 20 is formed in a box shape in which the bottom of trapezoidal shape thereof is opened.

In the illustrated embodiment, instead of the trapezoidal shape, for example, the front shape of the negative pressure space may be formed into an upward expanding semicircular shape, and the shape of the negative pressure space 20 is not limited to the illustrated embodiment.

The opening 22 provided at the bottom portion of the negative pressure space 20 may be provided with a flange-shaped presser plate (an upper presser plate) 23 protruding in an outer peripheral direction from an opening edge (three sides except one side in the longitudinal direction in the embodiment shown in FIG. 1), and a space for disposing a rectifying plate 24 mentioned below is secured within a thickness of the upper presser plate 23.

In the illustrated embodiment, the presser plate (the upper presser plate) 23 mentioned above is formed by attaching an appropriately sized plate provided with a rectangular opening having the same size as the bottom face opening of the main body comprising the holding member 12 formed in the trapezoidal shape, and the opening formed in the presser plate 23 is aligned to the opening 22 of the negative pressure space 20, in this structure.

The size of the negative pressure space 20 can be changed to various sizes depending on the size of the workpiece W which is the subject to be processed, a cut processing width applied thereto, and a processing position of the workpiece W (for example, a cutting process along one side of an end portion of the plate-like two-dimensional workpiece W which is the rectangular plate, or a cutting process applied to a center portion, or the like), however, in the case that the negative pressure space 20 is enlarged in size excessively, it is necessary to increase a sucking speed within the negative pressure space 20 for recovering the fine abrasive floating therein, accordingly, a large-sized suction means is required. Therefore, such structure is not economical.

As one example, the size of the negative pressure space 20 in the illustrated embodiment is set such that the width $W_{mc}$ of the rectangular portion in a plan view is 80 mm, and the length $L_{mc}$ is 200 mm, and the height $H_{mc}$ of the trapezoidal portion in the front view is 109 mm including the thickness of the presser plate (the upper presser plate).

In this case, the rectifying plate 24 is provided within the opening 22 of the negative pressure space 20, as shown in FIG. 1, preferably in both sides of the injection hole 31 of the blast gun 30. In the case that the injection hole 31 of the blast gun 30 is formed in an elongated rectangular cross sectional shape as mentioned below, the rectifying plates 24 are provided in both sides of the injection hole 31 in an opening width $W_O$ direction of the injection hole 31 (See FIGS. 1 and 2), has a longitudinal direction in an opening length $L_O$ direction of the injection hole 31, and is inclined so as to put distance from said workpiece as far from said injection hole 31 in its width direction.

In the embodiment shown in FIG. 1, six (6) rectifying plates 24 are provided in one side of the injection hole 31, accordingly twelve (12) rectifying plates 24 are totally provided in both sides, and are arranged in parallel in such a manner that inclination angles in the width direction become constant.

The rectifying plate 24 provided as mentioned above allows a flow of the abrasive which is going to move along the surface of the workpiece W after being injected from the injection hole 31 of the blast gun 30 then bombarded onto the surface of the workpiece W to deflect upward then separate from the surface of the workpiece W (See FIG. 2B), whereby it is possible to securely prevent the fine abrasive from being attached to the surface of the workpiece W by the suction within the negative pressure space 20 through the intermediary of the suction devices 21a and 21b mentioned below, by making the fine abrasive float within the negative pressure space 20.

Further, in the structure of the negative pressure space 20 shown in FIG. 1, a view window 25 is formed by fitting a transparent glass plate or the like to a front face of the negative pressure space 20, thereby a state within the negative pressure space 20 can be seen through the intermediary of the view window 25.

It is preferable to provide the view window 25 that it enables to see generation of abnormality within the negative pressure space 20, for example, generation of clogging caused by aggregation of the fine abrasive, recovery defect of the abrasive, change of the processing state with respect to the workpiece W and the like, however, the view window 25 is an optional member.

The negative pressure space 20 configured as mentioned above is arranged in a state in which the opening 22 formed at the bottom portion thereof is opposed to the surface to be processed of the workpiece W being provided at the predetermined distance, whereby forming a space surrounded by an inner wall of the negative pressure space 20 and the workpiece W to be processed within the negative pressure space 20.

Blast Gun

A leading end portion of the blast gun 30 for injecting the abrasive to the workpiece W is arranged within the negative pressure space 20 configured as mentioned above.

The blast gun 30 is attached such that an injecting direction of the blast gun 30 is in a vertical direction to the workpiece W while passing through a top plate of the negative pressure space 20, and the injection hole 31 is arranged proximity or close to the surface of the workpiece W as shown in FIG. 1 in the illustrated embodiment.

The injection hole 31 provided in the leading end of the blast gun 30 is formed in an elongated rectangular shape in which the opening width $W_0$ is formed narrow, and is attached to the negative pressure space 20 in such a manner that the opening width $W_0$ direction of the elongated rectangular injection hole 31 is directed to the moving direction T of the workpiece W (See FIGS. 1 and 2).

Figure 2A:
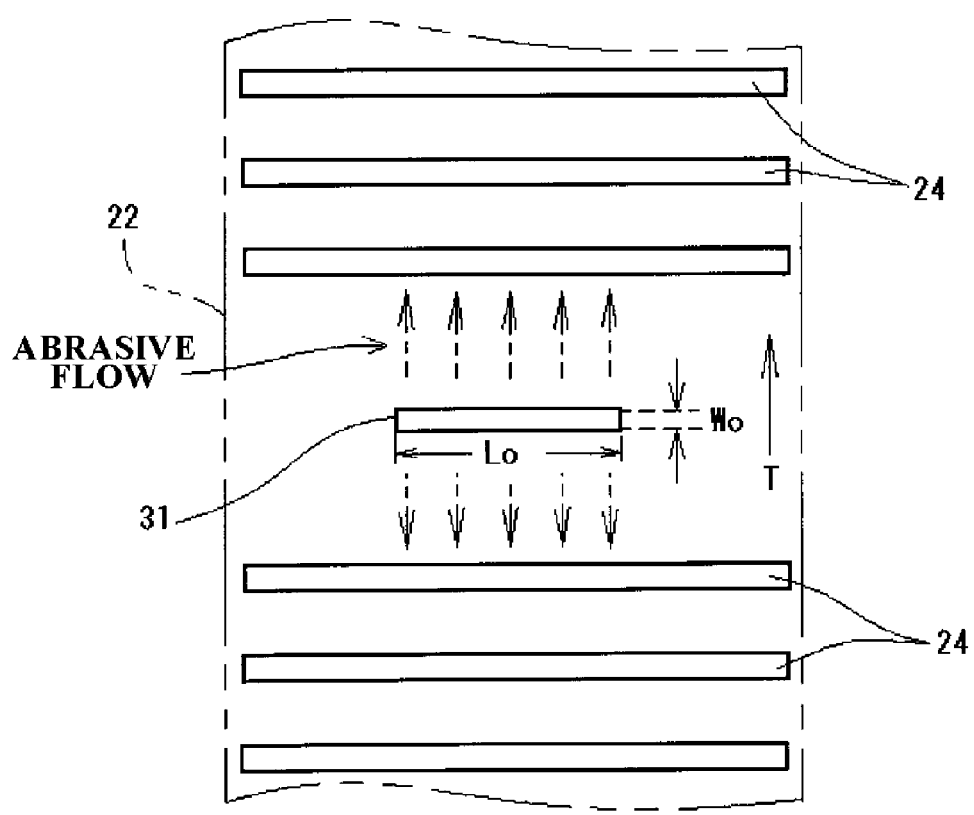
Figure 2B:
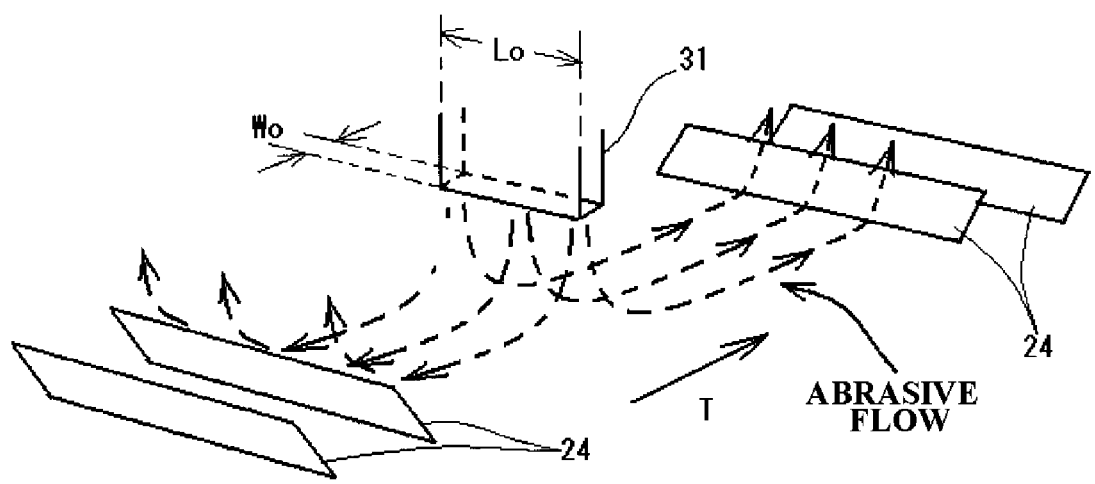

Generally, the abrasive injected from the blast gun, particularly the fine abrasive easily carried or wafted in a carrier gas flow due to its light weight flows along the surface of the workpiece together with the carrier gas flow when it is bombarded onto the surface of the workpiece. However, in the case that the abrasive is injected by the blast gun 30 provided with the injection hole 31 with elongated rectangular cross sectional shape as mentioned above, it is possible to control the diffusing direction of the abrasive flow after being bombarded onto the surface of the workpiece W to the opening width $W_0$ direction of the injection hole 31 as shown in FIG. 2A, accordingly, it is possible to prevent the cut width of the workpiece W from being enlarged. In order to obtain such effect more securely, the opening width $W_0$ of the injection hole 31 is preferably formed in a range within 0.1 mm to 100 mm. In the present embodiment, the rectangular opening of 0.5 mm×15 mm is formed.

Figure 16:
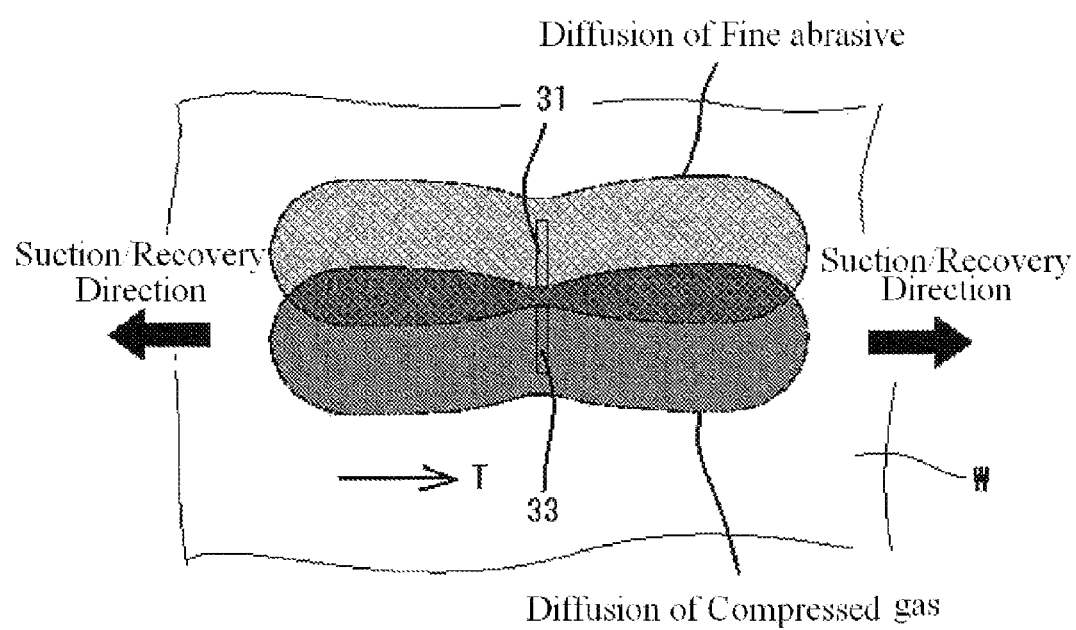
FIG. 16 is an explanatory view showing a diffusing direction of the fine abrasives (a plan view)

As mentioned above, in the case that the fine abrasive is injected by the blast gun 30 provided with the injection hole 31 with elongated rectangular cross sectional shape, the distribution of the abrasive on the workpiece corresponds to the injection hole 31 formed in a shape of the moving direction of the workpiece is a longitudinal direction after coming into collision with being bombarded onto the surface of the workpiece W so as to correspond to the injection hole 31 as shown in FIG. 16, the injecting distribution of the abrasive is expanded in the elongated rectangular shape as of width direction of the opening with both ends are in a circular arc shape and the center portion is a narrowed shape in width. As a result, it is possible to prevent the cut width of the workpiece W from being expanded.

Further, the opening length $L_0$ of the injection hole 31 with elongated rectangular cross sectional shape can be formed such a length as to correspond to the processing width with respect to the workpiece W, as one example.

As a matter of fact, in the case that the workpiece W is cut in a predetermined width along one side of the end portion of the workpiece W, the opening length $L_0$ may be formed longer with respect to the cut width. In this case, the position of the workpiece W with respect to the injection hole 31 or the position of the injection hole 31 may be adjusted so as to obtain a desired cut width, for example, as shown in FIG. 2A.

Suction Device

The negative pressure space 20 mentioned above is further provided with the suction device 21 (21a and 21b) for sucking the inside of the negative pressure space 20. The fine abrasive and the cut scrap floating within the negative pressure space 20 can be recovered by sucking the inside of the negative pressure space 20 through the intermediary of the suction device 21.

The suction device 21 is provided in such a manner as to be opened toward both sides in the opening width $W_0$ direction of the injection hole 31 of the blast gun 30 (See FIG. 1), and in the illustrated embodiment, the suction devices 21a and 21b are provided so as to be communicated with the inside of the negative pressure space 20 while passing through each of inclined surfaces formed at an oblique line portion of the trapezoidal portion in the front view.

Figure 3A:
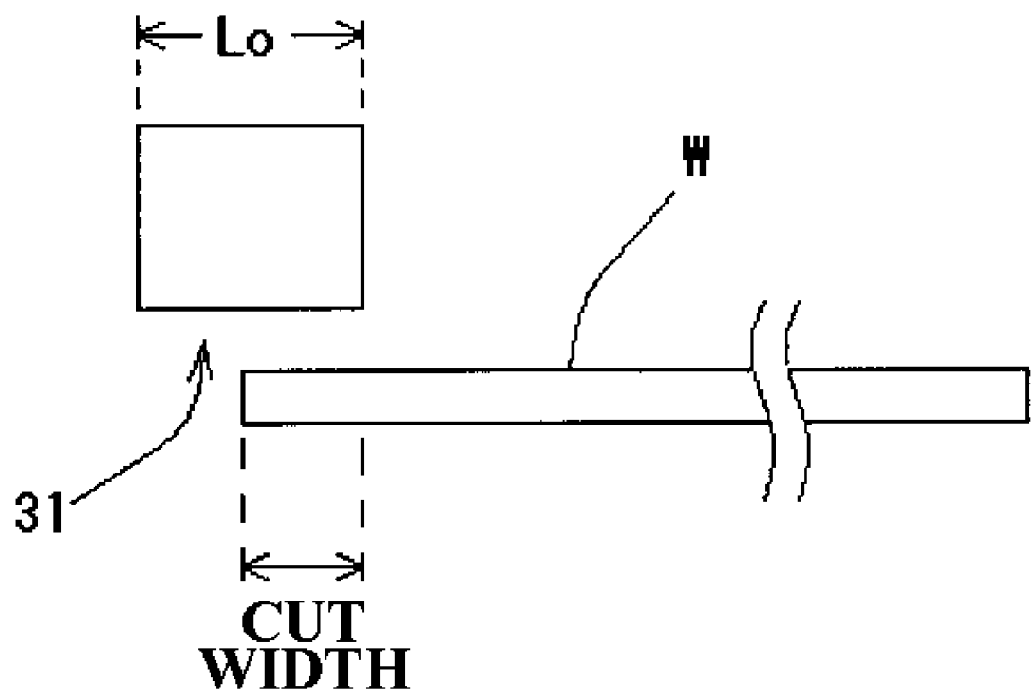
Figure 3B:
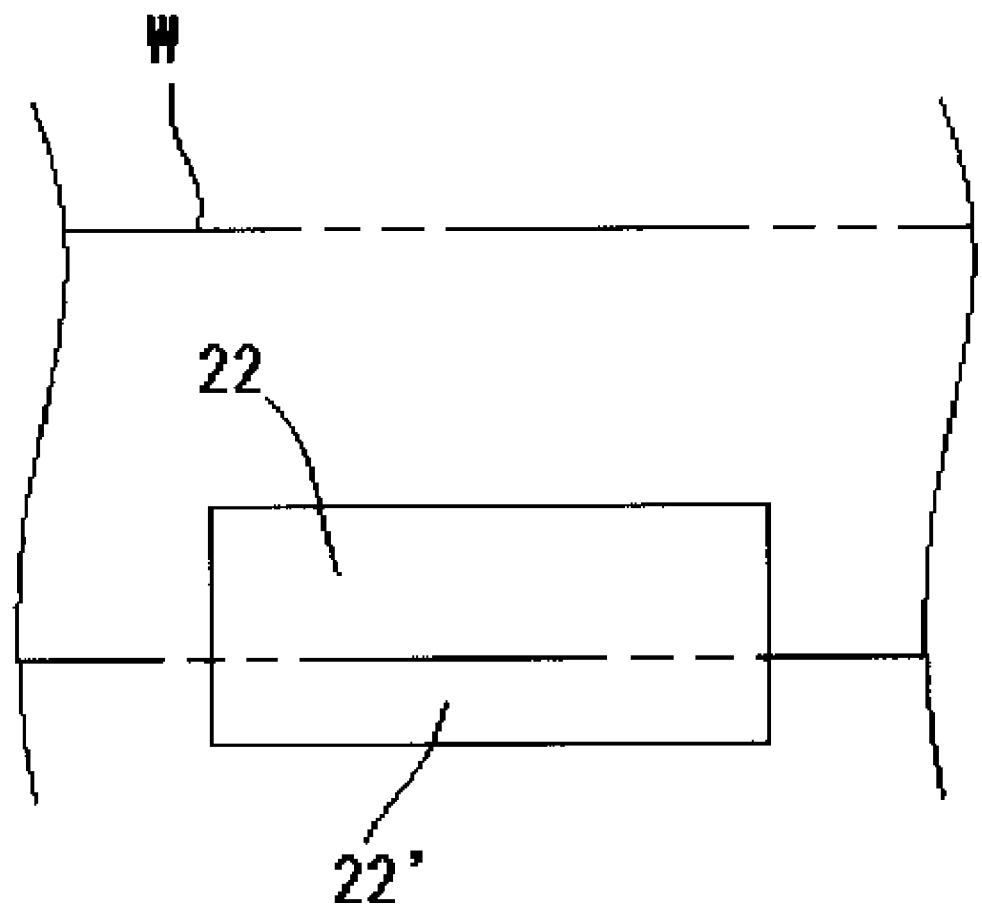
Figure 3C:
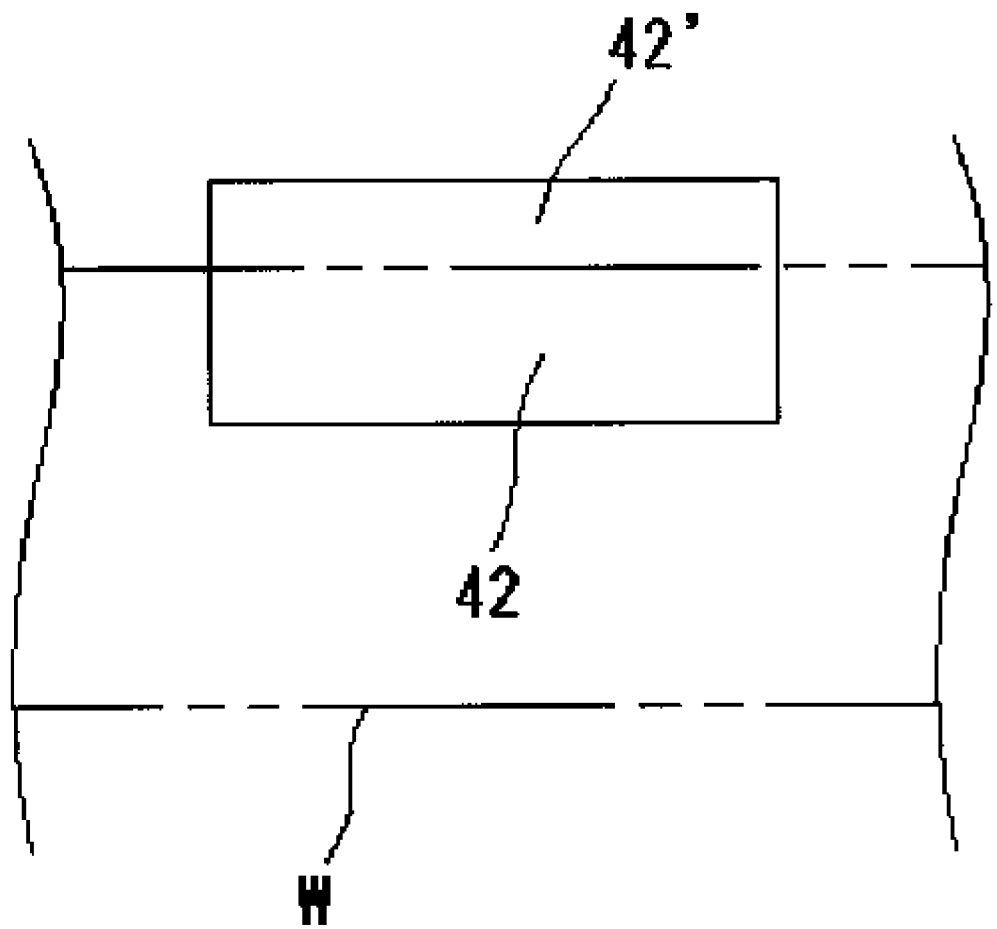
Figure 3D:
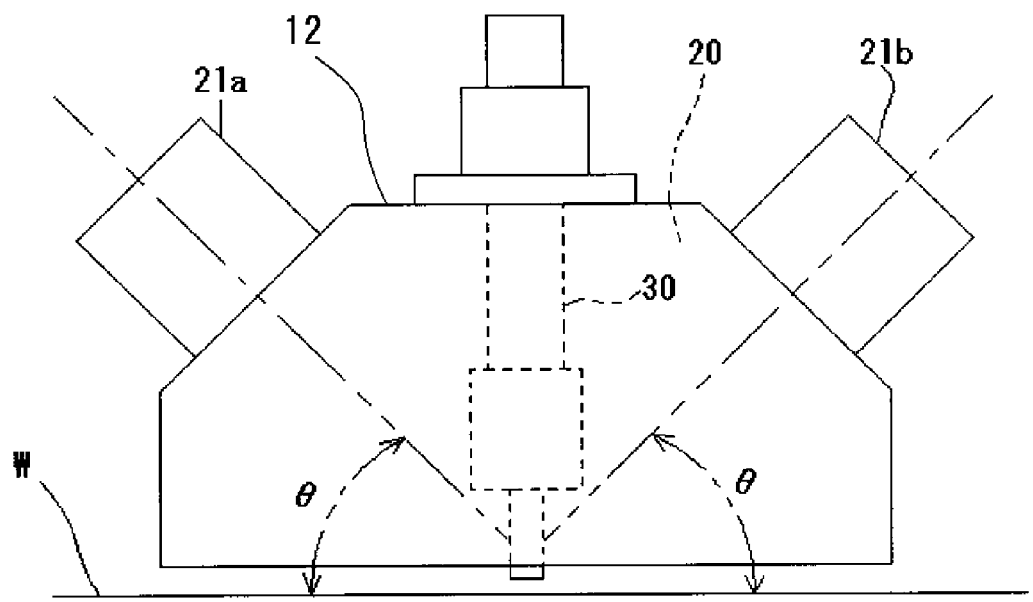

Preferably, the suction devices 21 (21a and 21b) are installed such that an angle θ formed by lines extending axes of the suction devices 21 (21a and 21b) and the surface to be processed of the workpiece W is in a range within 10 to 80 degree as shown in FIG. 3D. In the illustrated embodiment, the suction devices 21 (21a and 21b) are communicated with and opened to the space within the negative pressure space 20 while passing through both of the inclined surfaces of the trapezoidal box shape in which the bottom forming the negative pressure space 20 is opened in such a manner that the angle θ becomes 45 degree. Accordingly, it is possible to more effectively recover the fine abrasive by the suction within the negative pressure space 20.

In this case, the sizes of the suction device 21 can be changed to various sizes depending on the size of the negative pressure space 20, the performance of the used suction means (the dust collector 3 mentioned below) and the like, however, a diameter (an inner diameter) is 47.6 mm as one example, in the illustrated embodiment.

Opposing Negative Pressure Space

The opposing negative pressure space 40 can be arranged so as to oppose to the negative pressure space 20 provided with the blast gun 30 and the suction devices 21a and 21b described above.

The opposing negative pressure space 40 is constructed such that an opening 42 is formed on a top face of the opposing negative pressure space 40 in the illustrated embodiment, and the opening 22 formed at the bottom face of the negative pressure space 20, and the opening 42 formed on the top face of the opposing negative pressure space 40 are provided to oppose each other at a predetermined distance to allow a movement of the workpiece W to be processed while facing at least one side edge of the opening 22 to at least one side edge of the opening 42.

It is not always necessary to form the opening 22 of the negative pressure space 20, and the opening 42 of the opposing negative pressure space 40 as the same opening shape, however, in the illustrated embodiment, both are formed into the same shape, and are constructed such that opening edges of both the openings 22 and 42 overlap in a plan view.

The opposing negative pressure space 40 is formed into a hopper shape as a whole provided with an approximately rectangular tubular portion, and an approximately reverse pyramid shaped portion formed continuously below the rectangular tubular portion, in the embodiment shown in FIG. 1, and is constructed such as to be capable of sucking an inside of the opposing negative pressure space 40 by communicating the opposing suction device 41 with the lowest end of the reverse pyramid shaped portion.

Further, a lower presser plate 43 is protruded into a flange shape in an outer peripheral direction on an upper opening edge of the opposing negative pressure space 40, in the same manner as the negative pressure space 20 mentioned above.

When the spaces within the negative pressure space 20 and the opposing negative pressure space 40 are communicated with each other by providing the opposing negative pressure space 40 opposed to the negative pressure space 20, and sucking the inside of the opposing negative pressure space 40 as mentioned above, it is possible to recover the fine abrasive injected within the negative pressure space 20 through the intermediary of the opposing negative pressure space 40, and it is possible to compensate an upward suction force applied to the workpiece W generated by the suction within the negative pressure space 20 by a downward suction force generated by the suction within the opposing negative pressure space 40, thereby easily achieving the movement of the workpiece W.

Accordingly, as far as the operation mentioned above can be obtained, the shape of the opposing negative pressure space 40, and the formed position, the size and the like of the opposing suction device 41 are not particularly limited.

As a matter of fact, in the structure in which the opposing suction device 41 is formed in the center of the bottom portion of the opposing negative pressure space 40 as is the illustrated embodiment, since the opposing suction device 41 is disposed ahead of the injecting direction of the blast gun 30, it is possible to efficiently suck and recover the abrasive injected at a time of carrying out the injection of the abrasive in a state in which the workpiece W is removed from a front face of the blast gun 30, through the intermediary of the opposing suction device 41, and there is an advantage that it is possible to rapidly remove and recover the fine abrasive from whichever internal space of the negative pressure space 20 and the opposing negative pressure space 40.

In this case, in FIG. 1, reference numeral 44 denotes a rectifying plate provided within the opening 42 of the opposing negative pressure space 40. The rectifying plate 44 is disposed while setting a width direction thereof to a vertical direction, and forms a downward flow heading for the inside of the opposing negative pressure space 40, at a time when the abrasive is recovered within the opposing negative pressure space 40 located below.

Other Structures

In this case, since the illustrated recovery system 10 is constructed so as to cut one side of the plate-like two-dimensional workpiece W at a predetermined width, an insertion regulating body 51 is provided in a distance formed between the negative pressure space 20 and the opposing negative pressure space 40, as shown in FIG. 1, and an inserted position of the workpiece W is regulated by the insertion regulating body 51.

Accordingly, the structure is made such that if the workpiece W is inserted between the negative pressure space 20 and the opposing negative pressure space 40 until one side of the plate-like two-dimensional workpiece W is contacted and engaged with an edge of the insertion regulating body 51, and the workpiece W is moved in a state in which one side of the workpiece W is brought into slidable contact with the insertion regulating body 51, the surface of the workpiece W which is the subject to be processed can pass through the surface of the injection hole 31 of the blast gun 30.

Further, since a vicinity of one side of the workpiece W is processed as mentioned above, the negative pressure space 20 is connected to the opposing negative pressure space 40 by a back plate 52 as shown in FIG. 1, in the manner that a side surface of the opposite side to the insertion side of the workpiece W, and the negative pressure space 20 is formed by providing the inclined portion having the suction devices 21$a$, 21$b$ and both side faces of a holding member 12 and closing the back face with the back plate 52 and the front face of the space 20 with the view window 25 made of the glass plate or the like, respectively. However, for example, in the case that the cutting process of the predetermined width is carried out in the center portion of the comparatively large sized workpiece W while setting the moving direction to the longitudinal direction, the insertion regulating body 51 and the back plate 52 may be removed, and the negative pressure space 20 and the opposing negative pressure space 40 may be disposed in a state of vertically separated into two chambers completely.

Processing Method

The recovery system 10 according to the present invention as mentioned above is constructed such that a mixed fluid supply source supplying a mixed fluid of a compressed gas and a fine abrasive is communicated to a rear end portion of the blast gun 30 extended to an outer portion from a top plate of the negative pressure space 20.

Further, the structure is made such that the insides of the negative pressure space 20 and the opposing negative pressure space 40 can be sucked by communicating both the suction device 21 provided in the negative pressure space 20, two suction devices 21$a$ and 21$b$ in this case, and the opposing suction device 41 provided in the opposing negative pressure space 40, with the suction means such as the dust collector or the like in the recovery cycle constructed in accordance with the same principle as described in the related art.

As one example, FIG. 17 shows one structural example of the blasting apparatus 1 provided with the abrasive recovery system 10 according to the present invention mentioned above, and the rear end portion of the blast gun 30 provided in the abrasive recovery system 10 according to the present invention is communicated with a pressurizing tank 2 quantitatively feeding the fine abrasive as the mixed fluid with the compressed gas to the blast gun while weighing at a fixed amount.

Further, all of two suction devices 21$a$ and 21$b$ provided in the negative pressure space 20, and the opposing suction device 41 provided in the opposing negative pressure space 40 are communicated with the common dust collector 3 which is the suction means, whereby it is possible to suck an ambient air within each of the negative pressure spaces 20 and 40 so as to keep the ambient air under the negative pressure.

The fine abrasive within the negative pressure space 20 and the opposing negative pressure space 40 recovered by the dust collector 3 is sorted into a reusable abrasive and the cut scrap by a cyclone 3$a$ provided in the dust collector 3 so as to be recovered, and the reusable abrasive can be reused by being charged again into the pressurizing tank 2.

In this case, in the illustrated embodiment, reference numeral 4 in FIGS. 17 and 18 denotes a conveyor table. A carrier roller 5 provided on the conveyor table 4 is rotated by a rotation of a drive motor M and a gear, and the workpiece W mounted thereon can be carried in a predetermined direction.

In the illustrated embodiment, the vicinity of one side of the end portion of the workpiece W passes between the negative pressure space 20 and the opposing negative pressure space 40, by forming the negative pressure space 20 and the opposing negative pressure space 40 constructing the abrasive recovery system 10 according to the present invention to the one side 4a of the conveyor table in which the carrier direction of the workpiece W is set to the longitudinal direction, and moving the workpiece W mounted on the carrier roller 5 of the conveyor table 4, however, on the contrary thereto, a relative movement with respect to the workpiece W can be achieved by fixing the workpiece W, and transferring the negative pressure space 20 and the opposing negative pressure space 40 constructing the recovery system 10 according to the present invention.

Figure 19A:
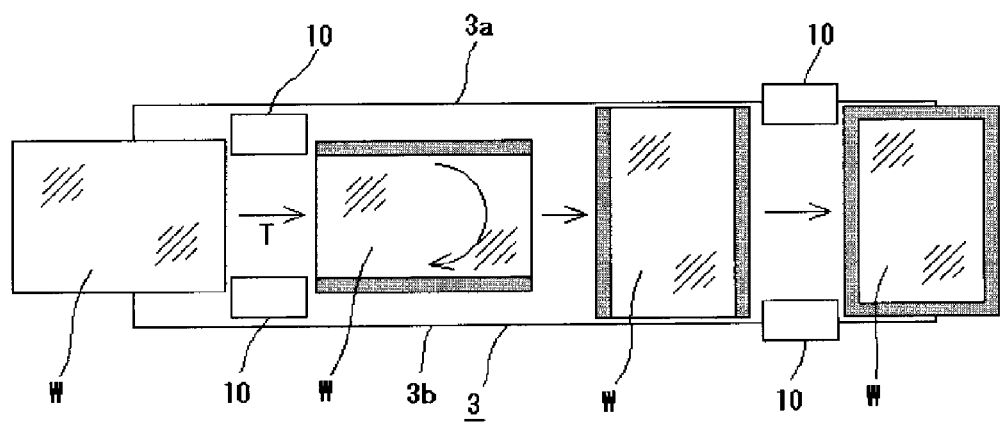
Figure 19B:
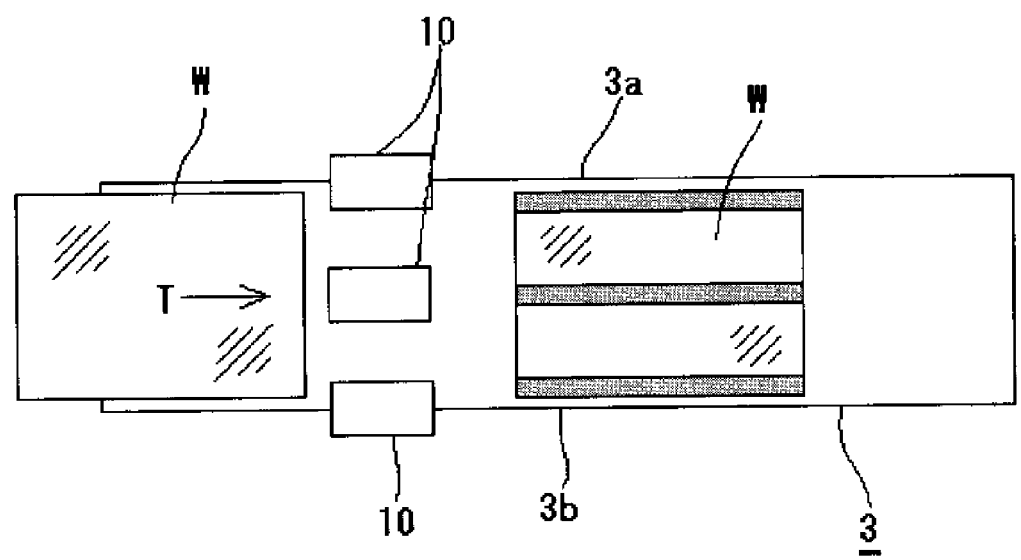
Figure 20:
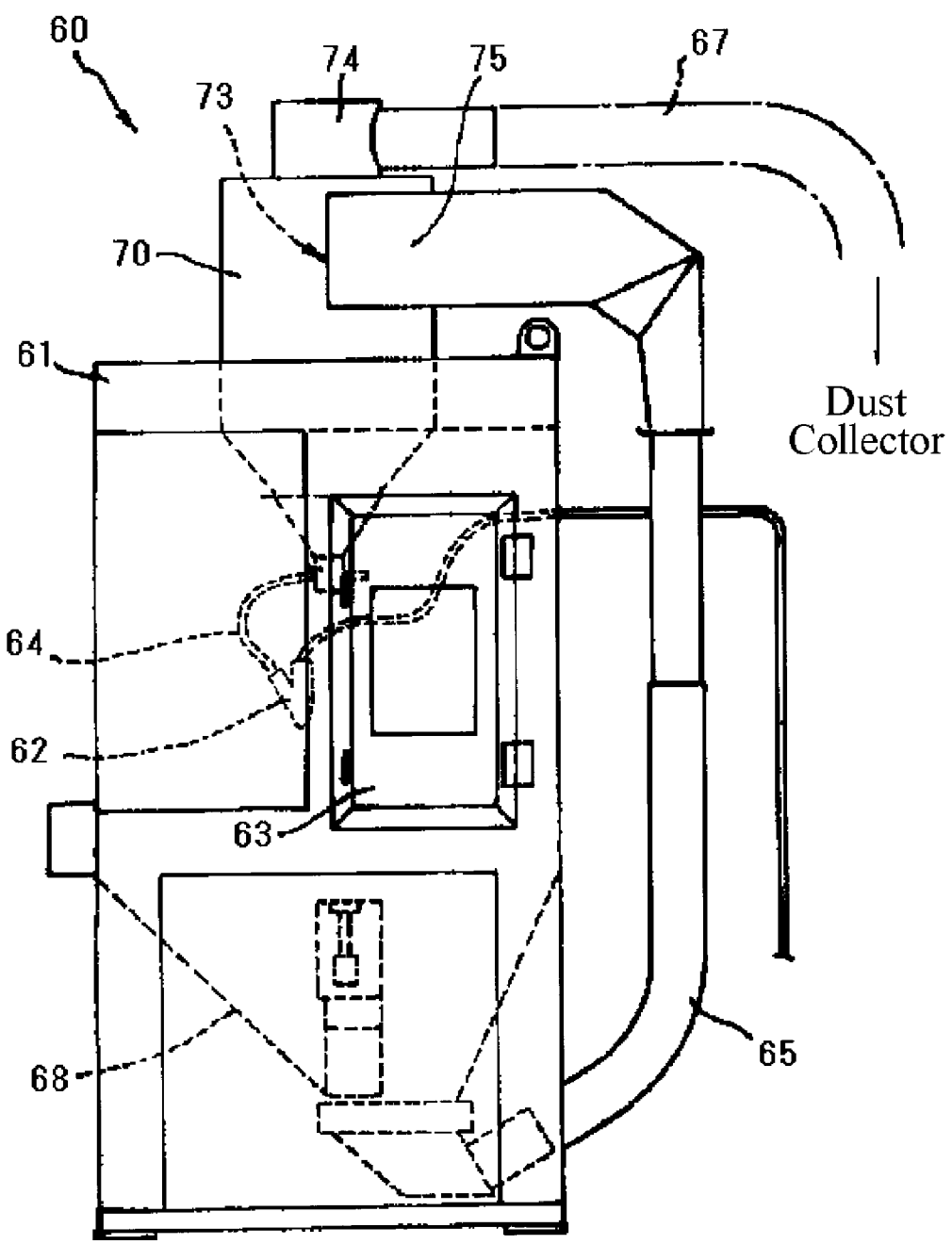
FIG. 20 is an explanatory view of a conventional blasting apparatus (of a gravity type)

Further, in the illustrated embodiment which can process the predetermined width in one side of the end portion of the workpiece W, the abrasive recovery system 10 according to the present invention is provided only on the one side 4a side of the conveyor table 4, however, for example, in the case of simultaneously processing each of two sides of the plate-shaped two-dimensional workpiece W, the abrasive recovery system 10 may be provided on the other side 4b of the roller conveyor thereby two sides of the plate-shaped two-dimensional workpiece can be processed simultaneously by carrying only one time. Further, as shown in FIG. 19A, for example, four (4) sides of the plate-shaped two-dimensional workpiece may be processed by a continuous work accompanying the rotation of the workpiece W. Further, as shown in FIG. 19B, the abrasive recovery system 10 may be disposed at a position through which the center portion of the plate-shaped two-dimensional workpiece W passes, thereby the blasting process can be applied to the center portion and the other optional positions as well as the end line portion of the plate-shaped two-dimensional workpiece W.

As one example, in the case that the plate-like two-dimensional workpiece W which is the subject to be processed is a plate glass having a thickness 3 mm, intervals of the respective portions are as follows. In the illustrated embodiment, an interval between the negative pressure space 20 and the opposing negative pressure space 40 (an interval between the upper presser plate 23 and the lower presser plate 43 in the illustrated embodiment) is 7 mm, an interval between the plate-like two-dimensional workpiece W and the negative pressure space 20 (the upper presser plate 23) is 2 mm, and an interval between the plate-like two-dimensional workpiece W and the opposing negative pressure space 40 (the lower presser plate 43) is 1 mm. Further, in the illustrated embodiment in which the rectifying plate 24 is provided within the opening 22 of the negative pressure space 20, an interval between the rectifying plate 24 and the plate-like two-dimensional workpiece W is 0.9 mm, and an interval between the blast gun 30 and the plate-like two-dimensional workpiece W can be set to 3 mm.

If the abrasive is injected from the blast gun 30 in a state in which the piping connection to each of the devices and the interval regulation of each of the devices are finished in the manner as mentioned above, and the plate-shaped two-dimensional workpiece W is inserted and passed between the negative pressure space 20 and the opposing negative pressure space 40 while sucking the insides of the negative pressure space 20 and the opposing negative pressure space 40 by three suction devices 21a, 21b and 41, the plate-shaped two-dimensional workpiece W is cut continuously in the moving direction T, at a width which is the opening length $L_0$ of the injection hole 31 with an elongated rectangular cross sectional shape formed in the blast gun 30.

As mentioned above, in the case that the fine abrasive is injected by the blast gun 30 provided with the injection hole 31 with elongated rectangular cross sectional shape, as shown in FIG. 16, the injecting distribution of the fine abrasive after being bombarded onto the surface of the workpiece W is expanded in the elongated rectangular shape as of width direction of the opening with both ends and the center portion of which are in a circular arc shape and the latter is a narrowed shape in width, respectively. Thereby it is possible to prevent the cut width of the workpiece W from being expanded. In the present embodiment, the abrasive injected from the blast gun 30 provided with the injection hole 31 formed into the elongated rectangular cross sectional shape, particularly the comparatively narrow elongated rectangular cross sectional shape having the opening width $W_0$ within 0.1 mm to 3 mm, generates the flow along the surface of the workpiece W in the opening width $W_0$ direction of the injection hole 31, and no diffusion of the abrasive is generated in the opening length $L_0$ direction.

Accordingly, the workpiece W can be cut at the corresponding width to the opening length $L_0$ of the injection hole 31, by using the blast gun 30 provided with the injection hole 31 with an elongated rectangular cross sectional shape as mentioned above.

Further, the abrasive flow moving on the surface of the workpiece W in the opening width $W_0$ direction of the injection hole 31 as mentioned above is thereafter deflected into an obliquely upward flow by the rectifying plate 24 provided in the opening 22 of the negative pressure space 20 in such a manner as to put distance from the surface of the workpiece W (referred to FIG. 2B), and accordingly, the abrasive floats in the space within the negative pressure space 20.

Since the abrasive which is #400 or more, or has an average diameter 30 μm or less, that is, the fine abrasive used in the present invention, has a long flight duration at a time of floating, and tends to ride on the gas flow, the abrasive can be easily recovered together with the gas in the field in the floating state. Accordingly, the abrasive in the floating state mentioned above can be recovered together with the gas within the negative pressure space 20 by the suction from the suction devices 21a and 21b mentioned above. Once the abrasive or the like is attached to the surface to be processed of the workpiece W, it is impossible to peel or fall away it by the after blow and the water washing is required, as mentioned above. However, according to the present invention, it is possible to easily recovery the abrasive before being attached.

The space within the negative pressure space 20 becomes negative pressure at a time of recovering the abrasive carried out as mentioned above, and the workpiece W is sucked upward by the negative pressure, however, the downward suction force is simultaneously applied to the workpiece W by the suction within the opposing negative pressure space 40 opposed to the negative pressure space 20. As a result, the workpiece easily passes through each of the openings opposed by being spaced each other at the fixed interval between the negative pressure space and the opposing negative pressure space depending on a balance between the both.

Preferably, the downward suction force generated in the opposing negative pressure space 40 is equal to or larger than the upward suction force generated in the negative pressure space 20, by forming the interval between the workpiece W and the opposing negative pressure space 40 narrower than the interval between the workpiece W and the negative pressure space 20. Accordingly, by pressing the workpiece W against the carrier roller 5 of the conveyor table 4, for example, in the case that the plate-like two-dimensional workpiece W is the thin-film solar cell panel or the like, it is possible to avoid the generation of such a problem that each of the thin film layers formed on the glass substrate is damaged due to the contact with the upper presser plate 23.

In the case of processing the one side end portion of the plate-like two-dimensional workpiece W such as the illustrated embodiment, a position of the end portion of the workpiece W is regulated by the insertion regulating body 51 at a time of cutting the workpiece W. As a result, the opening 22 of the negative pressure space 20 and the opening 42 of the opposing negative pressure space 40 are communicated with each other through the intermediary of recovery openings 22' and 42' of which is not covered by the workpiece W as shown in FIGS. 3B and 3C.

As a result, the fine abrasive injected from the blast gun 30, and the cut scrap generated by injecting the fine abrasive are sucked and recovered by the dust collector through the intermediary of the suction devices 21a and 21b sucking the inside of the negative pressure space 20, as well as the fine abrasive and the cut scrap within the negative pressure space 20 are sucked and recovered through the intermediary of the space within the opposing negative pressure space 40 and the recovery openings 42' and 22' by the opposing suction device 41 sucking the inside of the opposing negative pressure space 40, so that the fine abrasive and the cut scrap within both the negative pressure spaces are efficiently recovered in the floating state before being attached to the surface of the workpiece W.

As a result, the opposing negative pressure space 40 and the opposing suction device 41 share the recovery of the fine abrasive and the cut scrap floating within the negative pressure space 20 together with the suction devices 21a and 21b, efficiently recover the fine abrasive entered to the rear face side of the workpiece W, and effectively prevent the attachment of the fine abrasive on the rear face of the workpiece W.

Further, if the workpiece W is removed from the interval between the negative pressure spaces by the movement of the workpiece W, both the negative pressure spaces 20, 40 are communicated with each other through the intermediary of a whole surfaces of the opening 22 of the negative pressure space 20 and the opening 42 of the opposing negative pressure space 40, the fine abrasive injected by the blast gun 30 is directly introduced into the opposing negative pressure space 40 then immediately recovered. As a result, the fine abrasive is prevented from collecting within the negative pressure spaces 20 and 40 even in the state in which no workpiece W is existed between both the negative pressure spaces.

On the other hand, in the case that the negative pressure space 20 and the opposing negative pressure space 40 are completely separated therebetween by the workpiece W such as the case that the process is applied, for example, to the center portion of the comparatively large-sized workpiece W, the abrasive injected within the negative pressure space 20 is recovered only through the intermediary of the suction devices 21a and 21b communicated with the negative pressure space 20 at a time when the workpiece W is interposed, and the suction within the opposing negative pressure space 40 works only for sucking the workpiece W downward. However, if the negative pressure space 20 is communicated with the space within the opposing negative pressure space 40 by the movement of the workpiece W, the abrasive injected within the negative pressure space 20 from the blast gun 30 is sucked and recovered through the intermediary of the opposing negative pressure space 40 and the opposing suction device 41.

As mentioned above, in the recovery system 10 according to the present invention provided with the structure mentioned above, it is possible to prevent the fine abrasive from being attached to the surface of the workpiece W at a time of the cutting process, and it is possible to carry out the cutting process with the predetermined width without sticking the mask to the workpiece W. Accordingly, the blasting process using the fine abrasive can be applied even to the workpiece which can not be washed with the washing water and can not be stuck the mask for example, such as the case of scribing the thin film formed on the glass substrate of the thin-film solar cell panel.

Further, even in the case that the process is applied to the workpiece which can be washed after the blasting process and can be stuck the mask, it is possible to omit the labor expended in the washing and the sticking of the mask, and the use of the resources such as the mask, the washing fluid and the like used for this work, and it is possible to widely reduce the cost of the cutting process.

Further, in the case that no workpiece W is existed between both the negative pressure spaces 20 and 40 such as before disposing the workpiece W between both the negative pressure spaces 20 and 40, or after the workpiece W passes between both the negative pressure spaces 20 and 40, and the like, the fine abrasive injected by the blast gun 30 is rapidly removed from the spaces within both the negative pressure spaces by the suction by the opposing negative pressure space 40, and is fed to the recovery cycle, accordingly no fine abrasive is collected in the space within the negative pressure space.

Next, an embodiment according to the second aspect of the present invention will be described with reference to the accompanying drawings. The members which are the same as the above mentioned embodiment is denoted with the same reference numerals, therefore, explanations for the same construction and operations are omitted.

Construction of the Abrasive Recovering System

Figure 4:
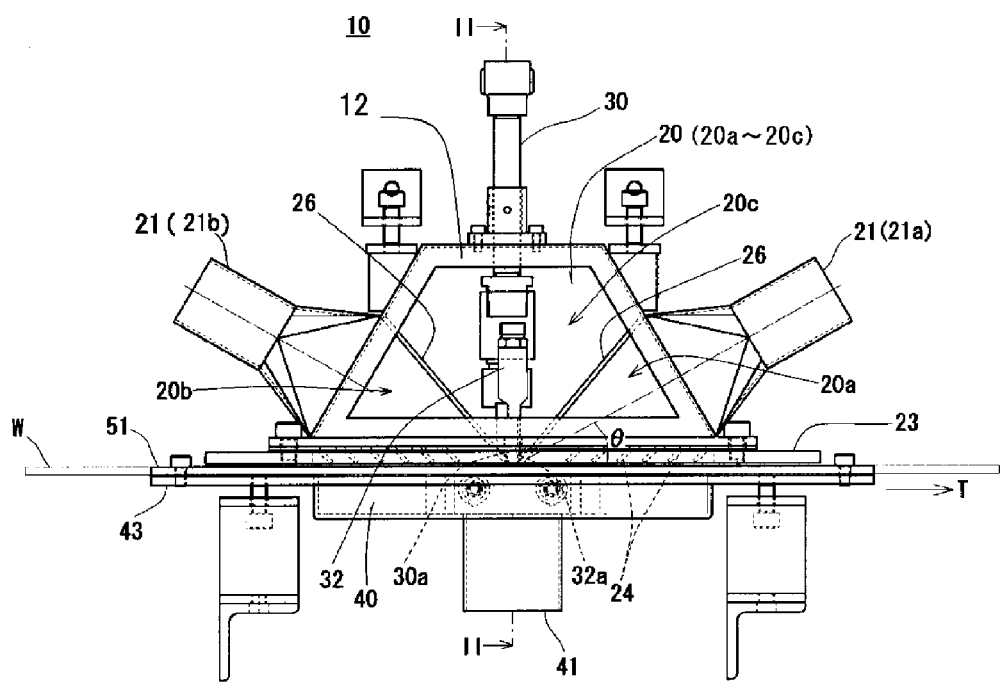
FIG. 4 is a front view of an abrasive recovery system.
Figure 5:
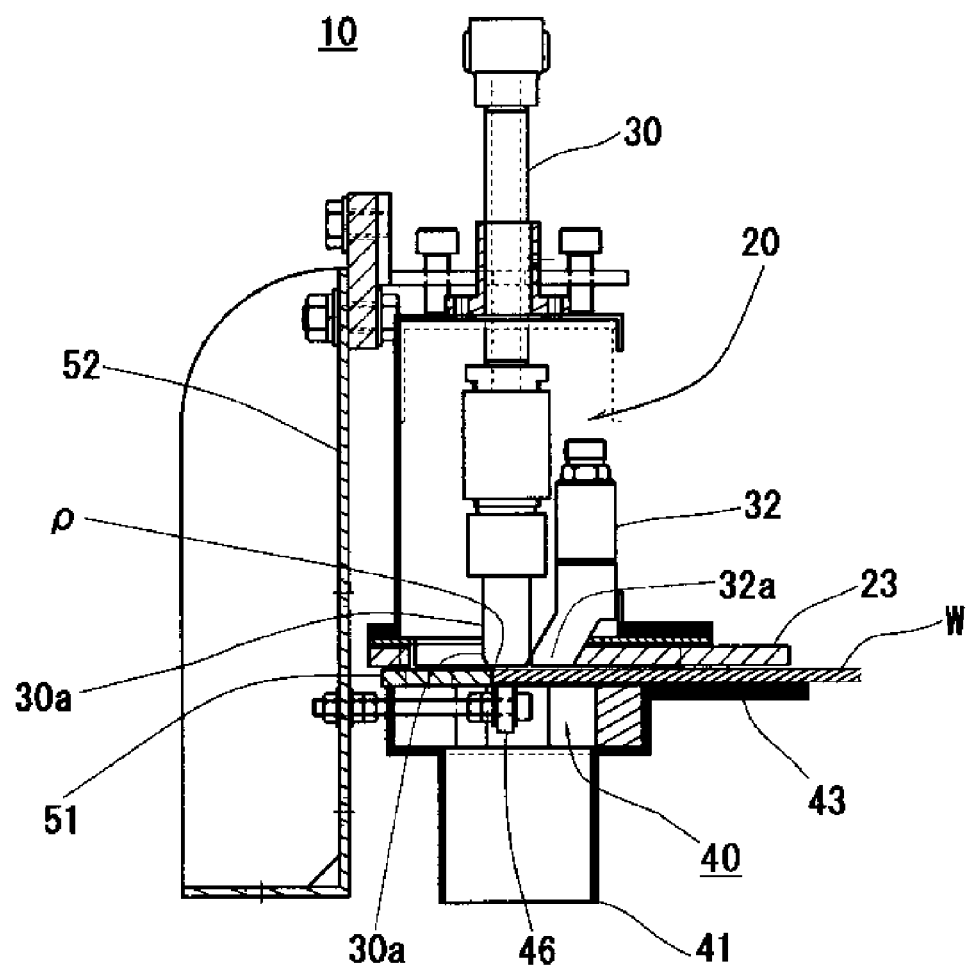
FIG. 5 is a cross sectional view of a II-II line of FIG. 4.

As shown in FIGS. 4, 5, the abrasive recovery system 10 according to the present invention is provided as is in the first aspect of the present invention described above, however composed of two negative pressure spaces 20a, 20b. Within the negative pressure spaces 20 (20a, 20b; hereinafter also simply referred to as "negative pressure space 20" in the case of indicating the both), a pair of suction devices 21 (21a, 21b) (hereinafter, simply referred to as "suction device 21" in the case of indicating the both, also in the present embodiment) sucking an inside of the negative pressure spaces 20 are provided.

In the present embodiment, the blast gun 30 in which the leading end 30a is faced is provided at the negative pressure space 20, and the blow nozzle 32 provided next to the blast gun 30 for carrying out air blow to the surface of the workpiece is arranged.

Negative Pressure Spaces 20 (20a, 20b)

Same as the embodiment according to the first aspect of the present invention described above (hereinafter, referred to as "the above mentioned embodiment"), the negative pressure spaces 20 are arranged with being opposed to the workpiece, and similarly, a rectangular opening 22 is provided at the bottom (See FIGS. 4 to 6).

Figure 15:
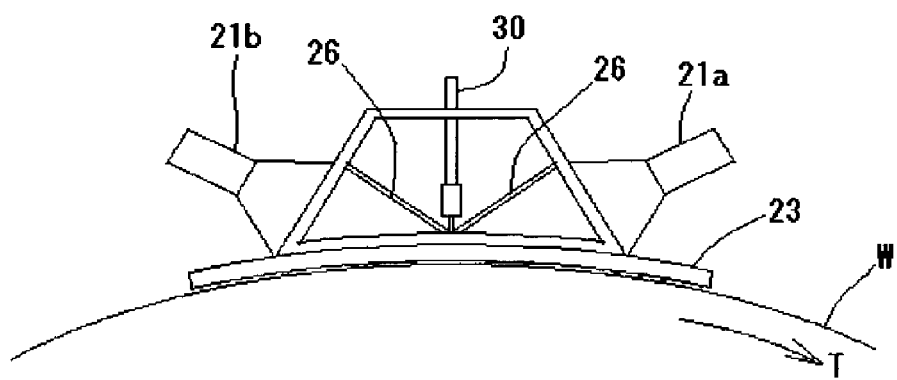
FIG. 15 is an explanatory view showing a variation of the negative pressure space.

In the illustrated embodiment, the workpiece processed by the blasting apparatus provided with the abrasive recovery system 10 according to the present invention is described as the one has a plate-like two-dimensional shape, however, the workpiece W which is an object to be processed is not limited to the one has such plate-like two-dimensional shape, for example, as shown in FIG. 15, the workpiece with cylindrical shape or columnar shape may be employed as the object to be processed. In such case, as shown in FIG. 15, an opposed surface of the negative pressure space 20 with respect to the workpiece has a shape which is curved corresponding to the surface shape of the workpiece.

Further, in an example shown in FIG. 15, an example carrying out a process with rotating the workpiece W with cylindrical shape or columnar shape is shown. However, it may be constructed so that an outer periphery of the workpiece W is processed with moving the workpiece W having a cylindrical shape or a columnar shape in the axial direction, or rotating while moving in the axial direction.

Opening

Figure 6:
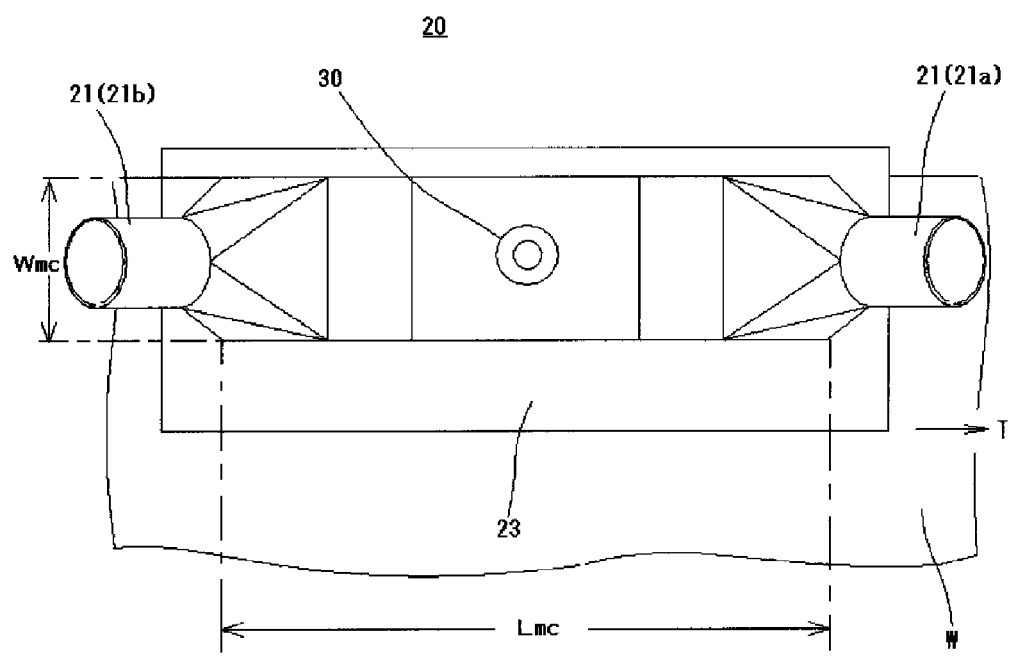
FIG. 6 is a plan view of the abrasive recovery system.

In the embodiment shown in FIGS. 4 to 6, same as the above mentioned embodiment (FIGS. 1 to 3), a rectangular opening 22 and an upper presser plate 23, an rectifying plate 24 are formed (see FIGS. 6, 7).

At a bottom of the negative pressure space 20, a space for disposing a rectifying plate 24 is secured within a thickness of the upper presser plate 23.

The bottom of the above mentioned negative pressure space 20 may be covered with the plate material in which a rectangular opening corresponding to the opening 22 is formed, then a portion of the plate material protruded from the bottom to an outer periphery direction may be formed as the pressure plate 23. In such construction, the opening formed on the presser plate 23 is served as an opening 22 of the negative pressure space 20.

A size of the negative pressure space 20 is the same as that of the embodiment in the first aspect of the present invention.

As one example, the size of the negative pressure space 20 is set such that a rectangular width W mc is about 50 mm to 150 mm in a plane view, a Length L mc is about 100 mm to 300 mm, a height of a trapezoid is about 50 mm to 150 mm in a front view. The size includes that of the above mentioned embodiment, but not restricted thereto.

Within the opening 22 of the negative pressure space 20, as shown in FIGS. 4, 7A, 7B and 5, the rectifying plate 24 is provided.

Figure 7A:
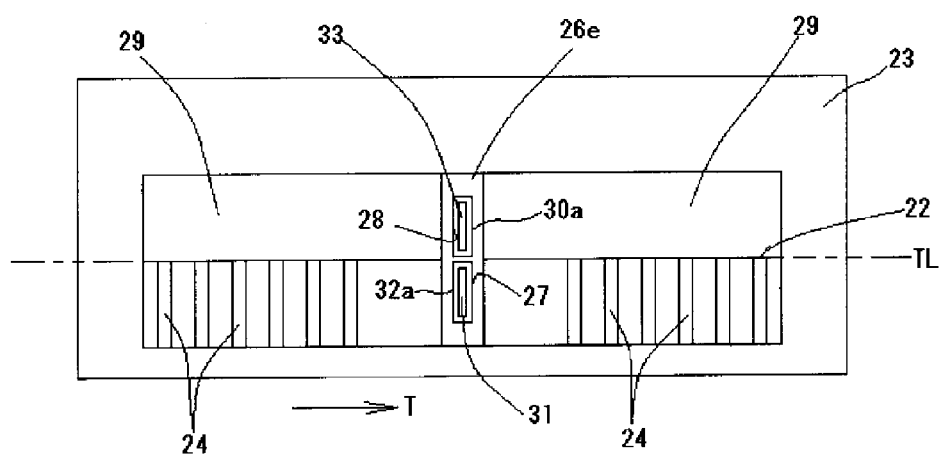
Figure 7B:
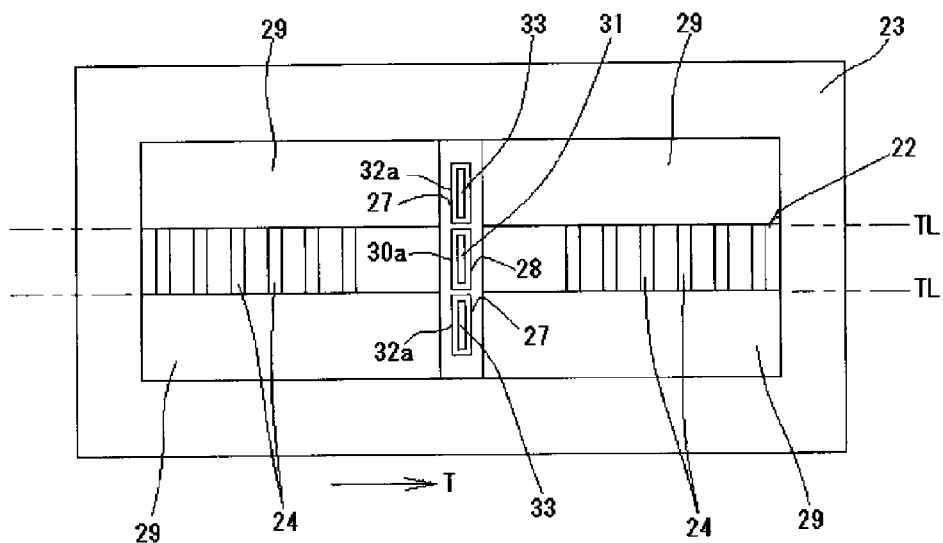
Figure 8:
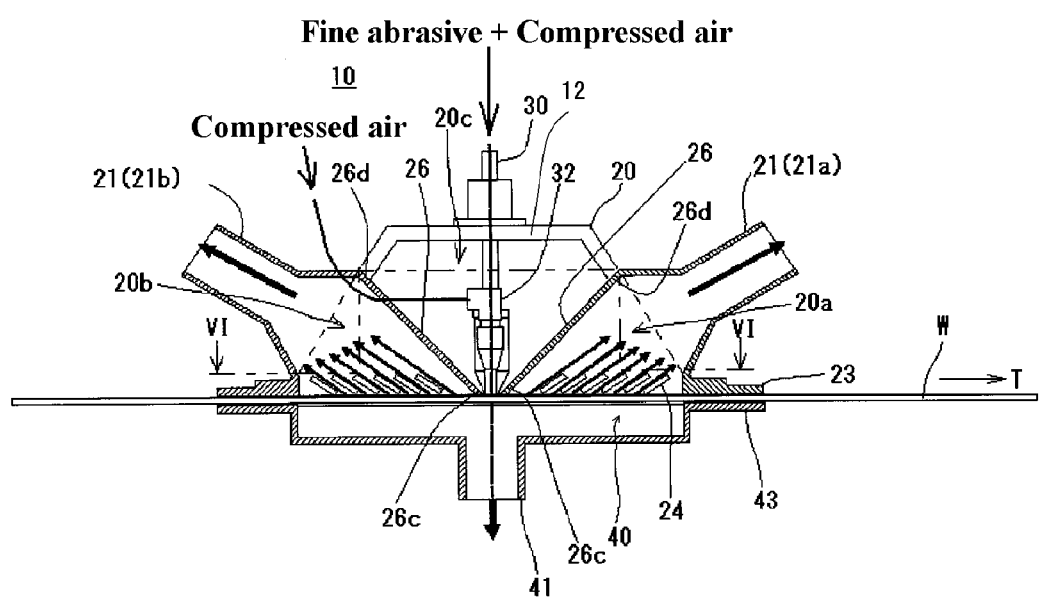
FIG. 8 is a cross sectional view of a front main section of the abrasive recovery system.

In the embodiment shown in FIGS. 4, 7 and 8, twelve (12) rectifying plates 24 are provided and arranged in the same manner.

Preferably, the rectifying plate 24 may be provided at a position separating by the predetermined distance from the injection hole 31 of the blast gun 30. If the rectifying plate 24 is provided at a position proximity or close to the injection hole 31, the rectifying plate 24 is abraded by the abrasive.

The rectifying plate 24 provided in such manner improves a recovery effect to securely prevent an attachment of the abrasives to the workpiece W (See FIG. 8).

The negative pressure space 20 is arranged in a state that the opening 22 is opposed to the surface to be processed of the workpiece W through the intermediary of a predetermined interval, same as the above mentioned embodiment.

Blast Gun

Within the negative pressure space 20 configured as described above, a leading end 30a of the blast gun 30 for injecting the fine abrasive to the workpiece W is contained.

In the illustrated embodiment, as shown in FIGS. 4, 7A, 7B, the blast gun 30 has a construction same as that of the above mentioned embodiment (FIGS. 1, 2), therefore the detailed description thereof is omitted.

The injection hole 31 of the blast gun 30 includes the above mentioned embodiment, however, as an example, the injection hole 31 has an opening hole width 0.05 mm to 3 mm, opening hole length 3 mm to 600 mm, and in the present embodiment, has the opening hole width 0.5 mm, the opening hole length 10 mm.

As mentioned above, the blast gun 30 provided with the injection hole 31 with an elongated rectangular cross sectional shape allows the injecting distribution of the abrasive to be expanded in the elongated rectangular shape as of width direction of the opening with both ends are in a circular arc shape and the center portion is a narrowed shape in width, as a result, it is possible to prevent an expansion of the cut width of the workpiece W.

A desired cut width is obtained by an opening hole length of the injection hole 31 with an elongated rectangular cross sectional shape and a positioning of the workpiece W.

Further, in the illustrated example, as described above, the blast gun 30 is described as the one provided with the injection hole 31 with an elongated rectangular cross sectional shape, however, a construction of the blast gun 30 is not restricted thereto. The blast gun 30 provided with the known injection hole with a round shape may be employed.

In this case, the blow nozzle 32 or the blow nozzle and the blast gun are arranged with being inclined to a forward or a backward of the moving direction T of the workpiece, thereby the diffusing direction of the abrasive after bombarded onto the surface of the workpiece can be directed to a forward or a backward of the moving direction of the workpiece, and a suction direction by the suction device and the diffusing direction of the fine abrasive are aligned by arranging the above described suction device 21 (21a or 21b) at a front side of the inclination direction of the blow nozzle 32 or the blow nozzle and the blast gun 30, accordingly, the fine abrasive can be effectively recovered (FIG. 19).

Thus, in a case that the blow nozzle 32 or the blow nozzle and the blast gun is provided with being inclined, different from the embodiment shown in FIG. 4, only the suction device 21 (21a or 21b) may be provided at one side of a forward or a backward of the inclination direction of the blow nozzle 32 or the blow nozzle and the blast gun 30.

A construction of which the abrasive is injected to the surface of the workpiece with being inclined as described above, may be employed in combination of the blast gun 30 having an elongated rectangular cross sectional shape described above.

As an example, an inclination angle of the blow nozzle 32 or the blow nozzle and the blast gun to the surface of the workpiece is in a range of 5 to 90°.

In addition, as an example, the injection pressure of the fine abrasive by the blast gun 30 is in a range of 0.05 to 1.5 MPa, and in the present embodiment, 0.15 MPa.

Blow Nozzle

In the negative pressure space 20, the blow nozzle 32 for injecting compressed gas to the workpiece W is arranged as well as the blast gun 30 described above.

As shown in FIGS. 5, 7A and 7B, the blow nozzle 32 is arranged next to the injection hole 31 of the blast gun 30 in an orthogonal direction to the moving direction T of the workpiece W, thus to the width direction of the formed groove and faced to the injection hole 33 of the blast gun 30. In the illustrated embodiment, the injection hole 33 of the blow nozzle 32 has an elongated rectangular shape same as the injection hole 31 of the blast gun 30 described above. As shown in FIGS. 7A and 7B, the longitudinal direction of the injection hole 33 of the blow nozzle 32 is arranged so as to be positioned at an extension of the longitudinal direction of the injection hole 31 of the blast gun 30 described above.

As one example, the injection hole 33 of the blow nozzle 32 has an opening hole width of 0.1 mm to 10 mm, an opening hole length of 5 mm to 30 mm, and in the present embodiment, the opening hole width is 0.5 mm and an opening hole length is 10 mm.

In a case that a groove is formed on the workpiece along one side of the workpiece W, for example, it suffices that the fine abrasive is prevented from being dispersed at an opposite side to the one side of the workpiece W, accordingly, as shown in FIG. 7A, the injection hole 33 of this the blow nozzle 32 may be provided only at one side of the injection hole 31 of the blast gun 30 (an upper side of FIG. 7A).

On the other hand, in a case that the groove is formed on for example, a center portion of the workpiece W, it is required to prevent the fine abrasive from being dispersed in any side of the orthogonal direction to the moving direction T of the workpiece W. In the case, as shown in FIG. 7B, the injection holes 33, 33 of the blow nozzles 32, 32 are respectively arranged at either side of the injection hole 31 of the blast gun 30 (upper and lower sides in FIG. 7B).

Preferably, a straight line TL parallel to the moving direction T of the workpiece W and passing between the leading ends of the blast gun 30 and the leading end of the blow nozzle 32 is assumed, and from the straight line TL, the opening 22 of the negative pressure space 20 at a side of which the blow nozzle 32 is arranged is closed with a plate-like two dimensional piece 29 or the like made of metal or resin excluding a position where the leading end of the blow nozzle 32 is arranged.

Compressed gas injected from the blow nozzle 32 is introduced in a relatively narrow space between the surface of the workpiece W and the plate-like two dimensional piece 29 as an inductive gas flow by closing the opening 22 of the negative pressure space 20 at the above described position with the plate-like two dimensional piece 29.

As a result, the fine abrasive injected from the blast gun 30 cannot be entered in the space, thus diffusion of the abrasive to the orthogonal direction with respect to the moving direction T the workpiece W can be preferably prevented.

Thereby, the fine abrasive can be precisely induced with being rode on the inductive gas flow in the negative pressure space to a side of the suction device 21 described below, corresponding to the suction device in the above described embodiment, accordingly accumulation of the fine abrasive on the workpiece can be prevented and a cut range of the workpiece W can be restricted. As a result, a groove can be formed on a surface of the workpiece at a high precision without sticking a mask material or the like.

In addition, regarding the blow nozzle 32, same as the blast gun 30, the injecting direction of the compressed gas to the surface of the workpiece may be inclined to a forward or a backward of the moving direction T of the workpiece W. In this case, same as the above described blast gun, the blow nozzle having the injection hole with a round shape may be employed as well as the above described blow nozzle having the injection hole 33 with the elongated rectangular cross sectional shape.

In a case of which the injecting direction by the blow nozzle 32 is inclined as such, the inclination directions of the blow nozzle and the blast gun are inclined to the same direction.

In addition, inclination angles of both of the blast gun 30 and the blow nozzle 32 to the surface of the workpiece W are in the range of 5 to 90°, as an example.

Furthermore, preferably, the injection pressure of compressed gas injected from the blow nozzle 32 is set equal to or lower than the injection pressure of the fine abrasive by the previously described blast gun 30. Thus, it is possible to prevent the fine abrasive from being involved in the inductive gas flow injected from the blow nozzle 32 thus prevent the surface of the workpiece from being cut by setting the injection pressure of the compressed gas by the blow nozzle 32 comparatively low. On the other hand, if the injection pressure of the blow nozzle 32 is too low, it is impossible to prevent the fine abrasive from being diffused in the orthogonal direction with respect to the moving direction T of the workpiece W. As an example, the injection pressure is 0.05 to 1.5 MPa and in the present embodiment, the injection pressure is 0.08 MPa.

Suction Device

Basic construction and operation of the negative pressure space 20 (20a, 20b) and the suction device 21 provided thereto is the same as those of the above mentioned embodiment of FIGS. 1 and 3D (See FIGS. 1 and 3).

Different from the above mentioned embodiment, in the illustrated embodiment, the suction device 21 is mounted to the negative pressure space 20 so that an angle θ formed by lines respectively extended from axial lines of the suction device 21 (21a, 21b) and the surface to be processed of the workpiece W is 30°, then communicated and opened in the negative pressure space 20.

Further, sizes of the suction devices 21a, 21b are the same as those of the above described embodiment.

Partition Plate

More preferably, in order to form the above described negative pressure spaces 20a, 20b, the partition plate 26 may be arranged.

In the embodiment shown in FIG. 4, the partition plate 26 is arranged with being inclined obliquely upward from a position of a leading end of the blast gun 30 toward upward of an upper end of a pair of the suction devices 21a, 21b, and a flow of a mixed fluid comprising the fine abrasive and/or the cut scrap and air generated by suction within the negative pressure space 20a, 20b by the suction devices 21a, 21b can be induced to the suction device 21a, 21b.

Figure 9:
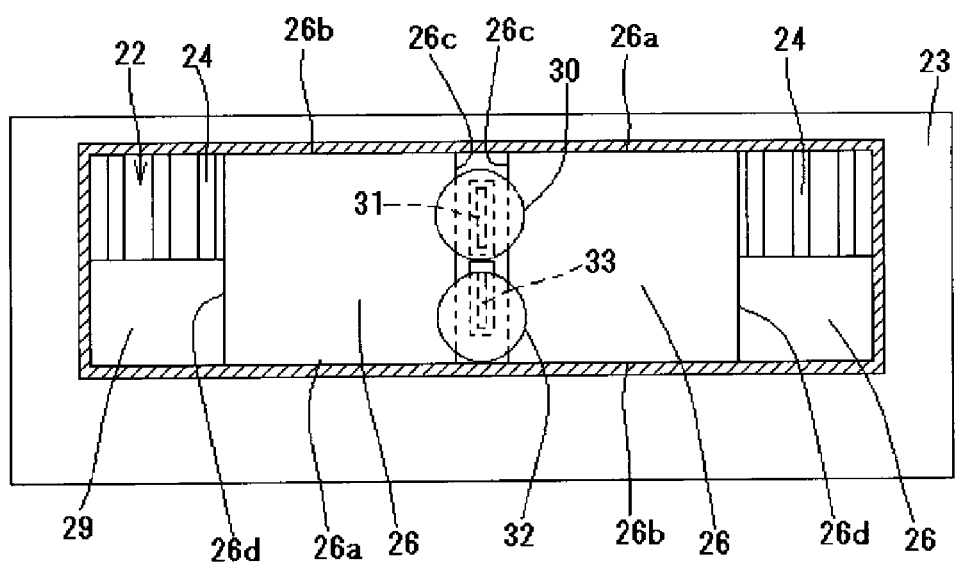
FIG. 9 is a cross sectional view of a VI-VI line of FIG. 8.

Preferably, as illustrated in FIG. 4 and FIG. 9, lower end sides 26c, 26c of the two partition plates 26, 26 are respectively arranged to the both sides of leading end positions of the blast gun 30 in the opening 22 of the negative pressure spaces 20a and 20b, and an upper end side 26d is mounted through the intermediary of the holding member 12 (FIG. 4 and FIG. 8) so as to form an inner wall of the negative pressure space 20a (20b), and as shown in FIG. 9, the negative pressure space 20 is formed by arranging so that the both sides 26a, 26b in the width direction form the both inner walls of the width direction of the negative pressure spaces 20a, 20b through the intermediary of the holding member 12.

As shown in FIG. 4, the such arrangement of the partition plate 26 allowing the negative pressure spaces 20a, 20b to be divided into a space 20c of which the blast gun 30 and the blow nozzle 32 are arranged and the negative pressure spaces 20a, 20b communicated with the pair of the suction devices 21a, 21b and securely induce the fine abrasive injected from the blast gun 30 to the suction device 21a, 21b through the intermediary of the negative pressure space 20a, 20b. It is not required that the partition plate 26 completely separate the negative pressure space as described in the illustrated embodiment, as long as the negative pressure space can be created by the suction negative pressure generated by the suction device 21, and a mixed fluid comprising the fine abrasive, the cut scrap and air can be induced from an inside of the negative pressure space to the suction device 21. For example, an upper end side 26d of the partition plate 26 may be arranged in a state separated each other, without being mounted to the negative pressure space 20 in a consolidation state.

Further, in a case that the upper end side 26d of the partition plate 26 is mounted to the holding member 12 and completely divide an inside of the negative pressure space 20 into three spaces 20a, 20b, 20c, only the spaces 20a, 20b sucked by the pair of the suction devices 21a, 21b are closed in a substantially air tight state and the space 20c formed at a center position, in which the blast gun 30 and the blow nozzle 32 are contained may be in a state opened in the atmosphere without being closed. Therefore, two chambers having the suction devices 21a, 21b defined by the partition plates 26, 26 are formed as the negative pressure spaces.

Figure 10A:
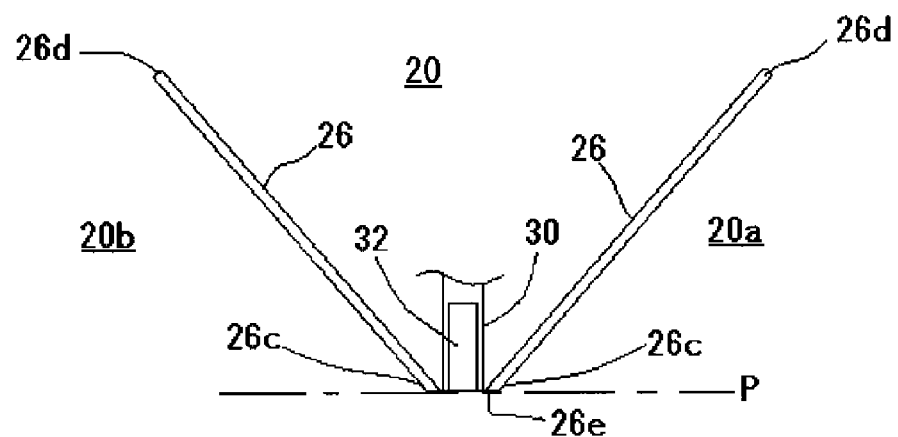
Figure 10B:
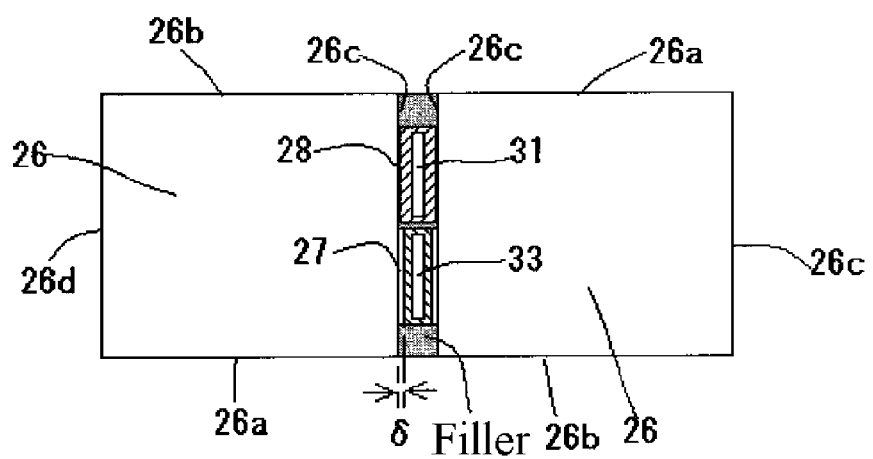

If such partition plate 26 is provided, as an example, as shown in FIGS. 10A, 10B, leading ends of the blast gun 30 and the blow nozzle 32 may be mounted to the lower end side 26c of the partition plate 26 so that the leading ends of the blast gun 30 and the blow nozzle 32 may be inserted between the two partition plates 26, 26, and closed by filling a filler or the like between the lower end sides 26c, 26c of the both partition plates 26, 26 other than the insertion position.

Figure 11A:
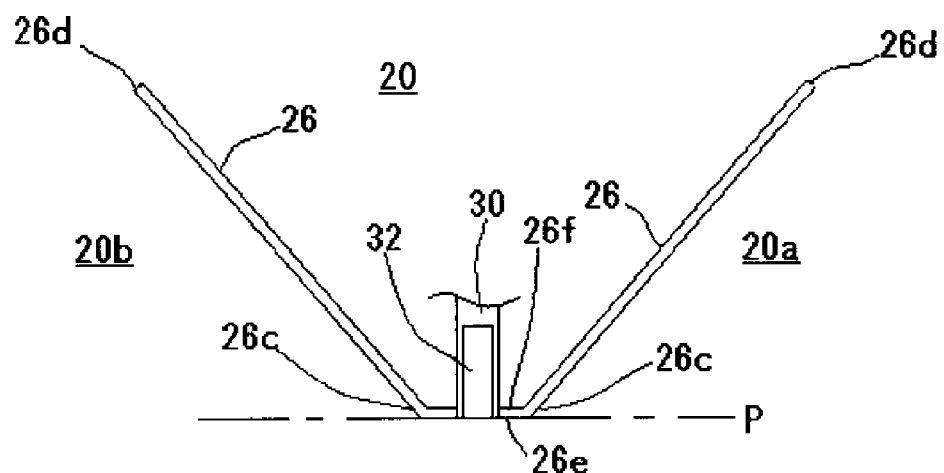
Figure 11B:
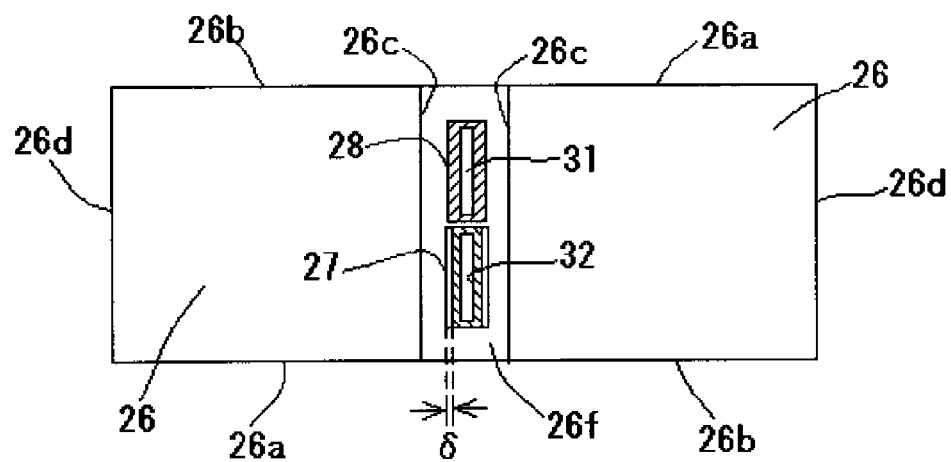
Figure 12A:
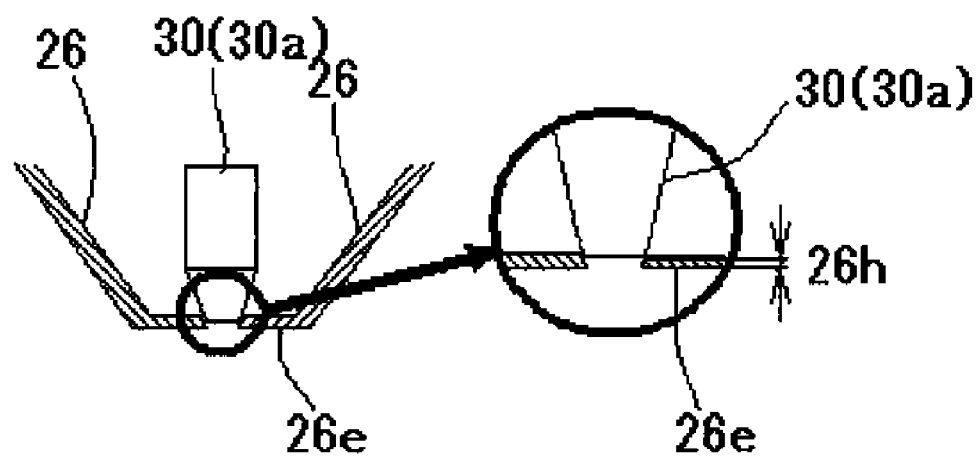
Figure 12B:
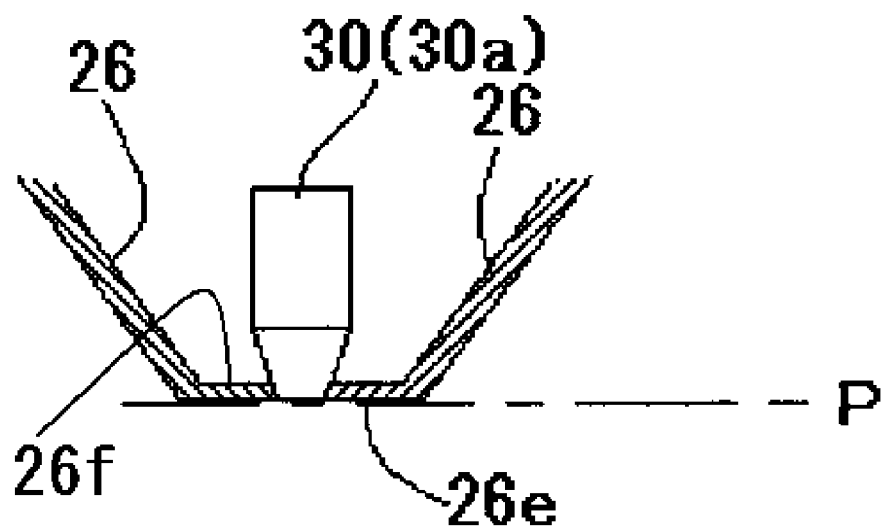
Figure 13A:
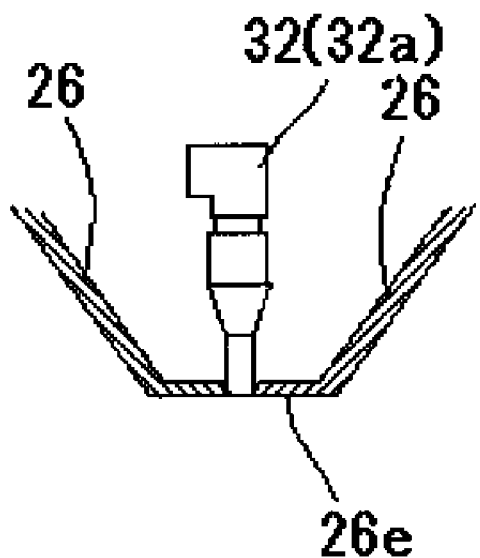
Figure 13B:
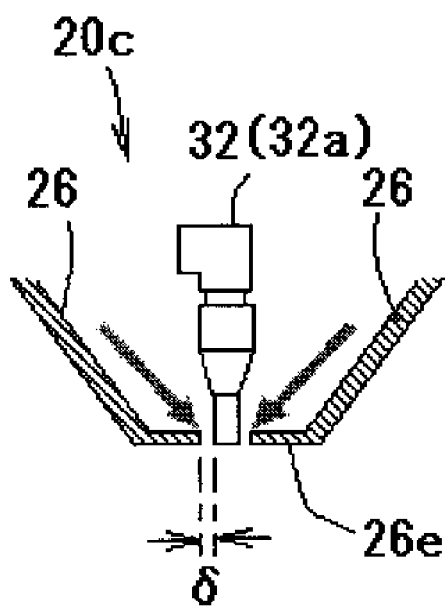

Alternatively, as shown in FIGS. 11A, 11B, a plate material is bent in a substantially V-shaped so that a flat portion 26f formed a little wider than leading end widths of the blast gun 30 and the blow nozzle 32 is formed, and the two partition plates 26, 26 are integrally connected at the lower end sides 26c, 26c through the intermediary of the flat portion 26f, and a hole 27 for the blow nozzle and a hole 28 for the blast gun 30 are respectively formed at the flat portion 26f of the partition plate 26, and in the holes 27, 28, leading end portions 30a, 32a of the blast gun 30 and the blow nozzle 32 may be respectively inserted (See FIG. 12B).

In any constructions described above, an end face of the leading end portion 30a of the blast gun 30 and the lower end face 26e formed between the lower end side 26c, 26c of the partition plates 26, 26 are arranged on the same plane, i.e., on a plane P so that no space is formed between an outer periphery of the leading end portion of the blast gun 30 and the partition plate 26.

For example, as shown in FIG. 12A, in a case that the end face of the leading end portion 30a of the blast gun 30 is arranged upward with respect to the lower end face 26e of the partition plate 26 and a gap 26h is formed between the both end faces, the abrasives injected from the injection hole 31 of the blast gun 30 are bombarded onto the gap 26h formed between the end face of the leading end side of the blast gun 30 and the lower end face 26e thereby a swirling current is generated, as a result, a turbulence of a flow of the abrasive after injection is generated.

As a result, it is impossible to accurately induce the abrasive injected from the injection hole 31 of the blast gun 30 to sides of a pair of the suction devices 21a, 21b, thereby accumulation and/or attachment of the fine abrasive to the workpiece W may be generated.

On the other hand, as described above, in a case that the end face of the leading end side of the blast gun 30 and the lower end face 26e of the partition plate 26 are arranged on the same plane, i.e., on a plane P as shown in FIG. 12B, no gap 26h is formed as is in FIG. 9A thereby a generation of a swirling current can be prevented and the diffusing direction of the abrasive can be accurately controlled. Therefore, it is possible to accurately induce the diffusing direction of the abrasive to a side of the suction device 21, effectively recover the fine abrasive, accordingly prevent an attachment of the fine abrasive to the workpiece W.

In the both constructions shown in FIGS. 10, 11, a small interval δ, as an example, the interval δ of around 0.8 mm to 10 mm is formed between an inner periphery of the hole 27 for the blow nozzle formed between the lower end sides 26c, 26c of the partition plates 26, 26 and an outer periphery of the leading end portion of the blow nozzle 32, and in the present embodiment, a size of the interval δ is 1.5 mm, as one example.

In the construction shown in FIGS. 10A and 10B, for example, a small interval 6 may be formed between the leading end of the blow nozzle 32 and sides 26c, 26c of the partition plate 26, 26 by forming a width of the leading end of the blow nozzle 32 a little narrower than the width of the leading end portion of the blast gun and allowing sides 26c, 26c of the partition plates 26, 26 to be contacted with the leading end portion of the blast gun 30. Furthermore, in the construction shown in FIGS. 11A and 11B, the interval δ may be generated between an opening edge of the blow nozzle the hole 27 and an outer periphery of the leading end portion of the blow nozzle 32 by forming a width of an opening of a hole 27 for the blow nozzle a little wider than a width of the leading end portion of the blow nozzle 32.

For example, as shown in FIG. 16A, in a case that compressed gas is injected without providing the above described interval δ to the outer periphery of the leading end portion 32a of the blow nozzle 32, there is a possibility that the inductive gas flow injected from the blow nozzle 32 involves the fine abrasive existed between the lower end face 26e of the partition plate 26 and the surface of the workpiece W then being bombarded onto the surface of the workpiece W thereby a surface of the workpiece onto which the inductive gas flow from the blow nozzle 32 is bombarded (a portion without being cut) is cut a little.

However, as described above, by forming a small interval δ at an outer periphery of the leading end portion of the blow nozzle 32, as shown in FIG. 16B, if compressed gas with high pressure is injected from the blow nozzle 32, air in a space 20c in which no fine abrasive is existed is introduced to a side of the workpiece W by ejector phenomenon together with the inductive gas flow through the intermediary of the interval δ, as a result, it is possible to prevent the fine abrasive from being involved in the compressed gas injected from the blow nozzle 32, accordingly prevent unintentional cutting of the portion where no cutting is carried out. Specifically, it is possible to prevent the abrasive existed in the periphery from being involved in the inductive gas flow generated by compressed gas injected from the blow nozzle 32 and prevent cutting of a surface region of the workpiece faced to the injection hole 33 of the blow nozzle 32, where no cutting is carried out, as a result it is possible to preferably prevent the surface region of the workpiece W from being a satin-finished surface.

Opposing Negative Pressure Space

An opposing negative pressure space 40 may be arranged in the opposed direction with respect to the negative pressure space 20 provided with the blast gun 30, the suction device 21, the blow nozzle 32, and the partition plate 26 or the like described above.

Figure 14:
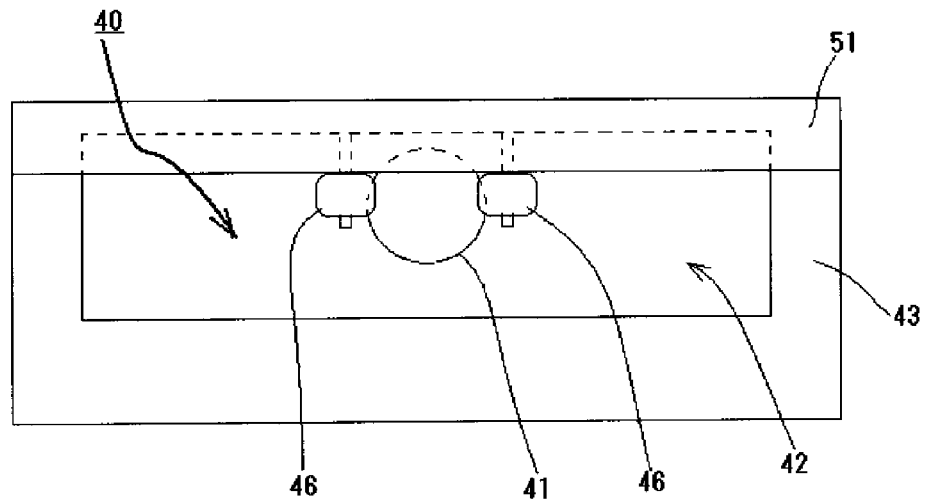
FIG. 14 is a plane view showing an opposing negative pressure space.

As shown in FIG. 14, the opposing negative pressure space 40 has a construction substantially same as that of the above mentioned embodiment (FIG. 1), therefore the detailed description thereof is omitted.

In the above described construction such that the opening provided at a bottom of the negative pressure space 20 is partially closed by the plate-like two dimensional piece 29, the opening 42 provided in the opposing negative pressure space 40 may be formed in a shape same as that of a part of the opening 22 of the negative pressure space 20 which is not closed by the plate-like two dimensional piece 29.

In the present embodiment, the opposing negative pressure space 40 has a box-shaped body opened upward as shown in FIG. 4, and the opposing suction device 41 communicating with an inside of the opposing negative pressure space 40 at a bottom thereof is provided for sucking an inside of the opposing negative pressure space 40 through the intermediary of the opposing suction device 41. However, a shape of the opposing negative pressure space may be changed in various shapes without being restricted in the illustrated embodiment, for example, substantially same as the above mentioned embodiment (FIG. 1), a bottom of the opposing negative pressure space may be formed in a shape of a hopper with an inverse pyramid shape then a lower end of the hopper may be communicated with the opposing suction device so as to easily induce the fine abrasive and the cut scrap to the opposing suction device 41.

The other detailed constructions are the same as those of the above mentioned embodiment.

The fine abrasive can be sucked and recovered from the opposing negative pressure space through the intermediary of the opposing suction device 41, thus the fine abrasive can be promptly removed and recovered from the negative pressure space of both the negative pressure space 20 and the opposing negative pressure space 40.

In FIG. 5 and FIG. 14, a reference numeral 46 denotes the carrier roller provided in the opening 42 of the opposing negative pressure space 40, and the carrier roller 46 reduces a resistance generated when the workpiece W is moved to the predetermined moving direction T by being contacted with a rear face of the workpiece W arranged between the negative pressure space 20 and the opposing negative pressure space 40.

Figure 21:
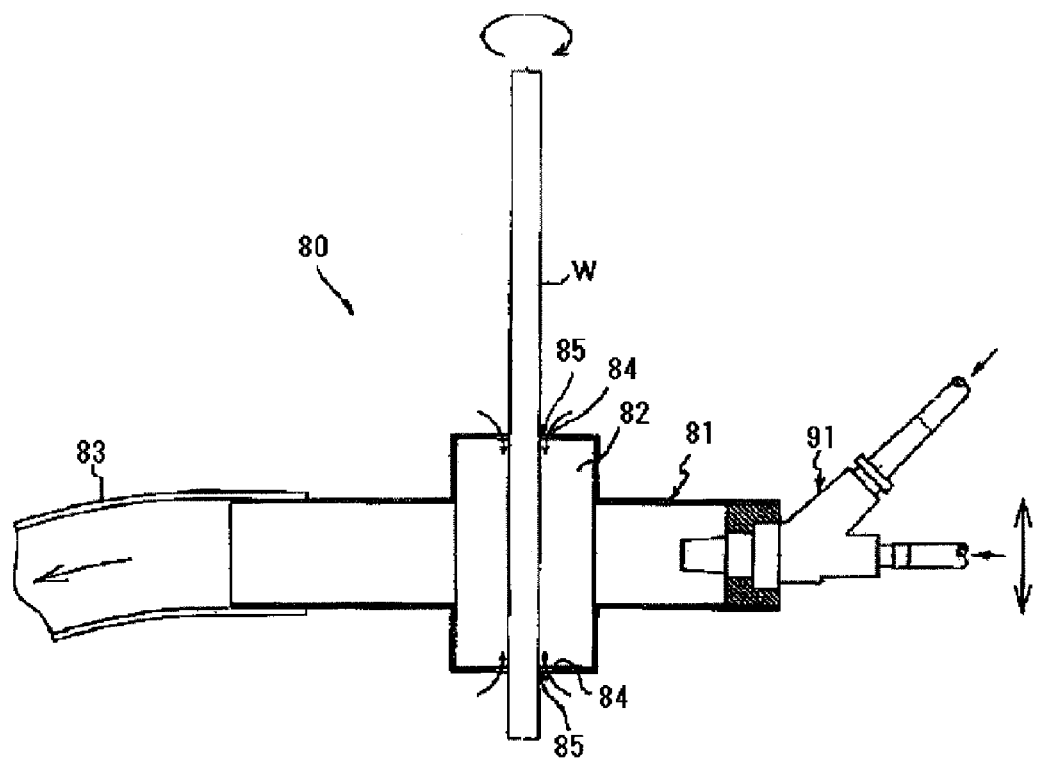
FIG. 21 is an explanatory view of a conventional apparatus (of Japanese Patent LOPI No. H09-300220)
Figure 22A:
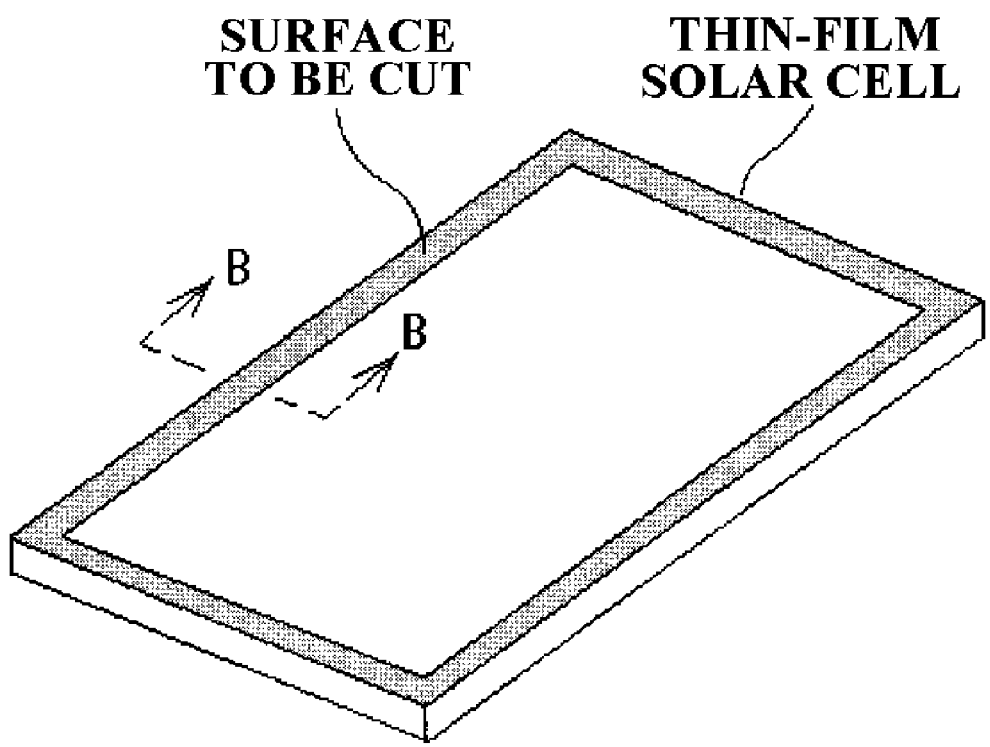
Figure 22B:
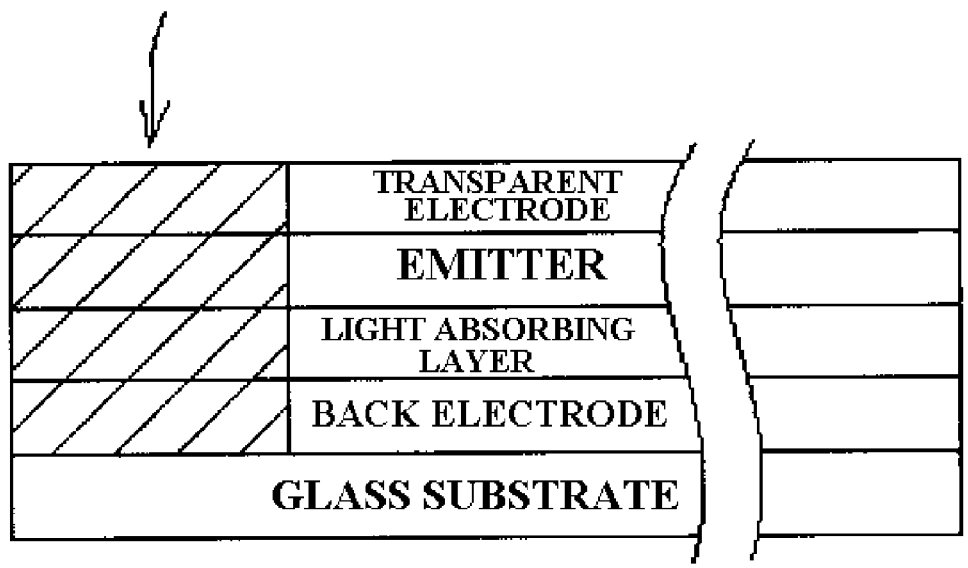
Figure 23:
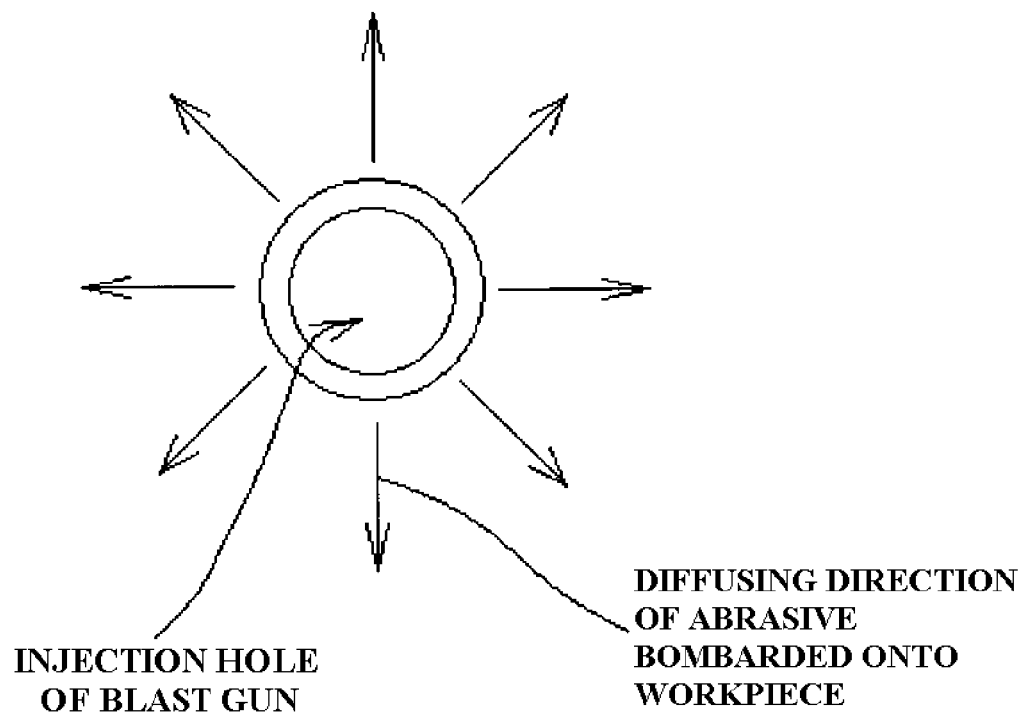
FIG. 23 is an explanatory view showing a diffusion state of the abrasive by a blast gun (with a round injection hole).

As described above, it is not necessarily to provide the opposing negative pressure space 40, and can be omitted same as the above mentioned embodiment. In this case, a pressurizing roller or the like (not shown) for pressurizing the workpiece W to the direction separating from the negative pressure space 20 (in the following examples described with reference to FIGS. 17, 21, pressurized on the conveyor table 4) may be provided instead of generation of suction force of the above described opposing negative pressure space 40 in order to prevent the workpiece W from being sucked by the suction negative pressure by the suction device 21 then contacted with the side of the negative pressure space 20.

In a case that the opposing negative pressure space 40 is omitted, in a state that the opening 22 of the negative pressure space 20 is not closed with the workpiece W, it is impossible to recover the fine abrasive because a flow of the fine abrasive injected from the blast gun 30 directed to a side of the suction device 21 is not generated.

Therefore, in a case that the opening 22 of the negative pressure space 20 is not closed by the workpiece W, for example, a front face of the opening 22 of the negative pressure space 20 may be covered with a dummy of the workpiece to recover the fine abrasive through the intermediary of the suction device 21.

In a case that the workpiece W is a curved plate shaped two-dimensional body, for example, same as the case of the negative pressure space 20, the opposing negative pressure space 40 is formed in a shape corresponding to a shape of the workpiece W which is an object to be processed.

Others

As shown in FIG. 5 and FIG. 14, the insertion regulating body 51 may be provided at an interval formed between the negative pressure space 20 and the opposing negative pressure space 40 same as the above mentioned embodiment and an operation of the interval is also same as that of the above mentioned embodiment.

Also in the illustrated embodiment, for example, a center portion of the workpiece W with relatively large size is cut in a predetermined width by setting the moving direction to the longitudinal direction, the insertion regulating body 51 and/or a back plate 52 may be removed to arrange in a state that the negative pressure space 20 and the opposing negative pressure space 40 are completely separated in a vertical direction.

Processing Process

A using method of the abrasive recovery system 10 of the present invention is also the same as that of the above mentioned embodiment.

Moreover, a hose communicated with a rear end of the blow nozzle 32 may be connected with a compressed gas supply source, such as an air compressor to supply the compressed gas to the blow nozzle 32.

Further, the suction device 21a provided in the negative pressure spaces 20a, 20b and the opposing negative pressure space 40 are communicated with suction means such as the dust collector for the above described recovering cycle, whereby insides of the negative pressure space 20 and the opposing negative pressure space 40 are sucked to create the ambient air under the negative pressure within the negative pressure spaces.

A construction employing the dust collector or the like described below can also be applied to the above mentioned embodiment in the same manner, however, suction negative pressure by the suction means such as the dust collector is −200 mmAg to 1500 mmAg, as one example, and in the present embodiment, −800 mmAg. The fine abrasive can be promptly sucked and recovered in a floating state before the fine abrasive is accumulated on the surface of the workpiece by setting the suction negative pressure higher (around −200 mmAg) than that of the known general blasting apparatus.

As an example, FIG. 17 is one structural example of the blasting apparatus 1 provided with the abrasive recovery system 10 according to the second aspect of the present invention described above, and same as the above mentioned embodiment.

In the present invention according to the aspect shown in FIGS. 17, 18, the rear end portion of the blow nozzle 32 is communicated with a compressed gas supply source 6 supplying compressed gas to the blow nozzle 32.

Moreover, the two suction device 21 and opposing suction device 41 are communicated with a common dust collector 3 so as to suck in order to create the negative pressure space.

Same as the above mentioned embodiment, a reusable abrasive separated by a cyclone 3a can be reused by being charged in a pressurizing tank 2 again.

A reference numeral 4 in FIGS. 17 and 18 denotes a conveyor table allowing the workpiece W to be carried in a predetermined direction.

A relative movement with respect to the workpiece W may be achieved by fixing the workpiece W, and transferring the negative pressure space 20 and the opposing negative pressure space 40 constructing the recovery system 10 according to the present invention.

Further, same as the above mentioned embodiment, two sides of the workpiece are simultaneously processed and as shown in FIGS. 16A and 16B, blasting can be applied at optional positions.

An outside air is introduced into the both negative pressure spaces by securing the interval or distance between each of the members when using, and the fine abrasive is prevented from scattering to the negative pressure space. Further, since the outside air is introduced along the surface of the workpiece W, it is possible to allow the fine abrasive which is going to be attached to the surface of the workpiece W to float by the outside air flow.

The following operation is the same as that of the embodiment in the above described first aspect of the present invention excepting a difference due to absence of the blow nozzle.

If the abrasive is injected from the blast gun 30 and the compressed gas is injected from the blow nozzle 32 in a state in which the piping connection to each of the devices and the interval regulation of each of the devices are finished in the manner as mentioned above, and the workpiece W is inserted and passed between the negative pressure space 20 and the opposing negative pressure space 40 while sucking the insides of the negative pressure space 20 and the opposing negative pressure space 40 by three suction devices 21a, 21b and 41, the workpiece W is cut continuously in the moving direction T, at a width which is the opening length of the injection hole 31 with an elongated rectangular cross sectional shape formed in the blast gun 30.

As described above, the fine abrasive is hard to be removed from the surface of the workpiece once accumulated on the workpiece W, on the other hand, the fine abrasive can be recovered relatively easily together with the air flow in a state that the fine abrasive is floated in the air before accumulated on the workpiece W or the like. Therefore, it is important to recover such fine abrasive in the state of which the fine abrasive is floated in the air before accumulated.

Therefore, in order to recover the injected fine abrasive without being attached to the workpiece W, the suction device 21 is arranged to a forward side of the direction of which the injected fine abrasive is moved together with the injected gas to align a diffusing direction and a suction direction of the abrasive for recover the fine abrasive before accumulated on the workpiece W.

In a case that a shape of the injection hole 31 of the blast gun 30 is formed in an elongated rectangular cross sectional shape as described above, since almost all of the fine abrasives are diffused in the width direction of the injection hole 31 after bombarded onto the surface of the workpiece W, the diffusing direction of the abrasive injected from the blast gun 30 can be aligned to a suction direction by the pair of the suction device 21a, 21b by arranging the width direction of the injection hole 31 to the moving direction T of the workpiece W.

However, even in the case that the blast gun 30 having the injection hole 31 with an elongated rectangular cross sectional shape is used, the diffusing direction of the fine abrasive injected from the blast gun 30 is spread in the longitudinal direction of the injection hole though it is a little amount (See FIG. 16).

In the construction of the abrasive recovery system 10 according to the embodiment of the present invention, in the same way, the abrasive is prevented from being diffused to an orthogonal direction with respect to the moving direction of the workpiece W by the inductive gas flow injected from the blow nozzle 32 generating the inductive gas flow by the flow of compressed gas substantially parallel to the injecting direction of the fine abrasive injected from the blast gun 30 by injecting compressed gas using the blow nozzle 32 provided with the injection hole 33 having an elongated rectangular cross sectional shape, thereby the abrasive can be induced to a pair of the suction devices 21a, 21b arranged at a front side of the moving direction by aligning the moving direction of the abrasive to a front-rear direction of the moving direction T of the workpiece W (FIG. 16).

As a result, the fine abrasive can be promptly recovered in a state that the fine abrasive is flown or floated before accumulated on the surface of the workpiece and prevented a generation of the fine abrasive accumulated on the workpiece W. That is, it is possible to prevent the abrasive injected from the blast gun 30 from being dispersed to a side of the inductive gas flow and the abrasive can be induced to a front side and/or a rear side of the moving direction T of the workpiece W.

Further, the fine abrasive injected from the blast gun 30 is prevented from being diffused over the width of the groove to be formed by injecting compressed gas from the blow nozzle 32, thus a groove with relatively accumulate width can be formed without using a mask material or the like.

As an example, in the present embodiment, in an example of processing a soda quartz glass using the abrasive made of WA (white alundum) #1000 (average particle diameter of 10 μm), the fine abrasive is injected at the injection pressure of 0.15 MPa by using the blast gun 30 provided with the injection hole 31 with an elongated rectangular cross sectional shape with the width of 0.5 mm and a length of 10 m and the compressed air is injected at the injection pressure of 0.08 MPa by using the blow nozzle 32 provided with the injection hole 33 having an elongated rectangular cross sectional shape with the width of 0.5 mm and a length of 10 m Vacuum pressure by the dust collector of this case is set to −800 mmAg, and a moving speed of the workpiece W is −1500 mm/min.

In the above described example, an example that both of the blast gun 30 and the blow nozzle 32 have the injection holes 31, 33 with an elongated rectangular cross sectional shape is described, however, even in a case that for example, the blast gun 30 having the injection hole with the known round shape is used, in the same way, the moving direction of the fine abrasive injected from the blast gun 30 can be aligned to the recovering direction by inclining the blast gun 30 to a direction of the suction device and, the fine abrasive which are going to be diffused to the orthogonal direction with respect to the recovering direction can be recovered before accumulated on the workpiece W by correcting to a flow of the recovering direction by compressed gas injected from the blow nozzle 32 inclined in the same way.

The rectifying plate 24 allows a flow of the abrasive which is going to move along the surface of the workpiece W to deflect upward then separate from the surface of the workpiece W (See FIG. 8), whereby it is possible to make the fine abrasive float within the negative pressure space 20.

Moreover, the partition plate 26 arranged in the negative pressure space 20 makes the injection flow of the fine abrasive injected from the blast gun 30 to be preferably recovered by being pulled from the negative pressure space within the negative pressure space generated by being sucked by the suction device 21 and induced to the suction device 21.

Particle size or the like of the fine abrasive employed in the present invention is the same as that of the above mentioned embodiment.

Regarding such alignment of the diffusing direction and the recovering direction of the fine abrasive, in a construction of which an end surface of a leading end side of the blast gun 30 and a lower end surface 26e formed between lower end sides 26c, 26c of the partition plates 26, 26 are formed on the same plane as mentioned above, no turbulence of a flow of the fine abrasive injected from the injection hole 31 of the blast gun 30 is generated, thus it is possible to prevent the fine abrasive from scattered in an unintentional direction.

The workpiece W is sucked to the side of the negative pressure space 20, however, the suction force to a side of the opposing negative pressure space 40 is simultaneously applied thereto. As a result, the workpiece easily passes through an interval between the negative pressure space 20 and the opposing negative pressure space 40.

Preferably, the workpiece W is pressurized to the carrier roller 55 of the conveyor table 4 to avoid the generation of such a problem that the workpiece W is damaged.

Moreover, a pressurizing roller or the like (not shown) for pressurizing the workpiece W to the conveyor table 4 or the like may be provided for preventing a contact between the workpiece W and the upper presser plate 23. In such the case that the workpiece W is pressurized to the conveyer table 4, the opposing negative pressure space 40 may be omitted as described above.

As the illustrated embodiment, a position of the end portion of the workpiece W is regulated by the insertion regulating body 51 at a time of processing the one side end portion of the workpiece W. As a result, the opening 22 of the negative pressure space 20 and the opening 42 of the opposing negative pressure space 40 are communicated with each other through the intermediary of an interval p generated between the workpiece W and the insertion regulating body 51 as shown in FIG. 5 (See FIG. 6).

The fine abrasive and the cut scrap are efficiently recovered in the floating state before being attached to the surface of the workpiece by carrying out air blow by the blow nozzle simultaneously with processing by the blast gun 30 as such.

Furthermore, even if the injection hole 33 of the blow nozzle 32 is provided only to one side in the longitudinal direction of the injection hole 31 of the blast gun 30, the fine abrasive diffused to the side of which the blow nozzle 32 is not provided can also be recovered through the intermediary of the opposing negative pressure space 40.

Moreover, respectively, the opposing negative pressure space 40 effectively prevent the attachment of the fine abrasive on the rear face of the workpiece W.

Further, even in a state that the workpiece W is removed from the interval between both the negative pressure spaces by the movement of the workpiece W, accordingly no workpiece W is existed between both the negative pressure spaces, the fine abrasive is prevented from collecting within the negative pressure spaces 20 and 40.

On the other hand, in the case that the negative pressure space 20 is communicated with the opposing negative pressure space 40 by operation of the opposing negative pressure space 40 and a movement of the workpiece W in such a case that the process is applied, for example, to the center portion of the comparatively large-sized workpiece W, the injected fine abrasive is sucked and recovered from the opposing negative pressure space 40 through the intermediary of the opposing negative pressure space 40 and the opposing suction device 41.

An operation and effect of the second aspect of the present invention having such construction described above is basically the same as those of the above mentioned embodiment.

Moreover, it is possible to widely reduce the cost of the cutting process.

Further, in the case that no workpiece W is existed between both the negative pressure spaces 20 and 40, no fine abrasive which is injected is collected in the space within the negative pressure space.

According the construction as described above, the present invention can be more effectively used in the case of carrying out a cutting process at a predetermined width to various workpiece and can be utilized as a substitute for a laser used for various etching and processing, for example, scribing a thin-film solar cell panel which has been conventionally carried out by the laser for the reason that it is impossible to use the mask material and wash, because it is unnecessary to carry out a step of sticking a mask material for limiting a cut range, washing by means of a washing liquid for removing the attached fine abrasive or the like.

Thus the broadest claims that follow are not directed to a machine that is configured in a specific way. Instead, said broadest claims are intended to protect the heart or essence of this breakthrough invention. This invention is clearly new and useful. Moreover, it was not obvious to those of ordinary skill in the art at the time it was made, in view of the prior art when considered as a whole.

Moreover, in view of the revolutionary nature of this invention, it is clearly a pioneering invention. As such, the claims that follow are entitled to very broad interpretation so as to protect the heart of this invention, as a matter of law.

It will thus be seen that the objects set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Now that the invention has been described;
What is claimed is:

1. A blasting method, comprising the steps of:
    sucking a space on a workpiece to be processed through a suction device communicating with said space to make said space as a negative pressure space;
    relatively moving said workpiece in an atmosphere with respect to an injection hole of a blast gun disposed within said negative pressure space so as to be opposed to a surface to be processed of said workpiece being provided each other at a predetermined distance;
    injecting a mixed fluid of a compressed gas and an abrasive, within said negative pressure space to said surface to be processed of said workpiece from an opening formed in said negative pressure space facing to at least one side edge of said workpiece in the same direction with a moving direction of said workpiece;
    injecting a compressed gas generating a gas flow having a diffusing direction substantially parallel to the moving direction of said workpiece, to said surface to be processed of said workpiece, during an injection of said mixed fluid to said surface to be processed; and
    sucking and recovering a cut scrap and said abrasive through said suction device.

2. The blasting method according to claim 1, wherein said compressed gas is injected from a blow nozzle, from at least one side of said injection hole to said surface to be processed of said workpiece, to suck and recover said cut scrap and said abrasive.

3. The blasting method according to claim 1, wherein a space below said workpiece is sucked at an opposite side to said surface to be processed of said workpiece opposed to said negative pressure space and said openings through an opposing suction device communicating with said space below said workpiece to make said space below said workpiece as an opposing negative pressure space, and a cut scrap and an abrasive are sucked and recovered from said negative pressure space and/or said opposing negative pressure space through said opposing suction device of said opposing negative pressure space from a recovery opening which is not covered by said workpiece, among said openings formed in said opposing negative pressure space and said negative pressure space.

4. The blasting method according to claim 1, wherein said injection hole of said blast gun having an elongated rectangular cross sectional shape is arranged proximity to said workpiece, and a longitudinal direction of said injection hole is arranged orthogonal to a relative moving direction of said workpiece so that an injecting direction of said blast gun is approximately vertical to said workpiece, then said mixed fluid of a compressed gas and an abrasive is injected in an elongated rectangular cross sectional shape according to a cross sectional shape of said injection hole, and said negative pressure space is sucked through said suction device of said negative pressure space from both sides of said injection hole in a direction of an opening width.

5. The blasting method according to claim 1, wherein a suction from said suction device of said negative pressure space is carried out with respect to said surface to be processed of said workpiece by setting an axial direction of said suction device to an inclination angle of 10 to 80 degrees.

6. The blasting method according to claim 1, wherein a flow of said cut scrap and said abrasive flowing along said surface of said workpiece is deflected in a direction to put distance from said surface of said workpiece by a rectifying plate provided within said opening of said negative pressure space in both sides of said injection hole and inclined so as to put distance from said workpiece as far from said injection hole in its width direction.

7. The blasting method according to claim 1, wherein an injecting distribution of said abrasive on said workpiece from said blast gun has a shape which has a longitudinal direction in said moving direction of said workpiece and said injection distribution of said gas flow from said blow nozzle is parallel to said longitudinal direction of said injection distribution of said abrasive from said blast gun.

8. The blasting method according to claim 7, wherein said injection distribution of said gas flow on said workpiece from said blow nozzle has a shape which has a longitudinal direction in said moving direction of said workpiece.

9. The blasting method according to claim 7, wherein said injection distribution of said gas flow from said blow nozzle has a similar shape with said injection distribution of said abrasive from said blast gun.

10. The blasting method according to claim 7, wherein said injecting direction of said blow nozzle is inclined to a front side or a rear side of said moving direction of said workpiece.

11. The blasting method according to claim 10, wherein said injecting direction of said blast gun is inclined to the same direction with said injecting direction of said blow nozzle.

12. A blasting apparatus comprising:
a space opposed-to a workpiece to be processed;
a blast gun within said space, said blast gun having an injection hole opposed to a surface to be processed of said workpiece, and said injection hole being provided on said surface to be processed of said workpiece at a predetermined distance,
wherein said workpiece is provided so as to be relatively moved with respect to said injection hole,
said space has an opening and a suction device, and said opening is positioned so that a longitudinal direction is set to the same direction with a relative moving direction of said workpiece, and faced to at least one side edge of said workpiece,
one end of said suction device is communicated with said space, and the other end of said suction device is communicated with a suction means, and said suction device sucks said space to make said space as a negative pressure space; and
a blow nozzle faced to said surface to be processed of said workpiece through said opening and generating an inductive gas flow composed of a flow of a compressed gas so as to have a diffusing direction substantially parallel to said moving direction of said workpiece, wherein said blow nozzle and an injection hole of said blow nozzle are arranged at least one side of an orthogonal direction to the moving direction of said workpiece, and said suction device is communicated with said negative pressure space from a front side of said diffusing direction of said inductive gas flow to a leading end of said blast gun, for sucking and recovering a cut scrap and an abrasive from said negative pressure space.

13. The blasting apparatus according to claim 12 wherein, a blow nozzle facing to said surface to be processed of said workpiece through said opening and generating an inductive gas flow composed of a flow of a compressed gas having a diffusing direction substantially parallel to said moving direction of said workpiece and an injection hole of said blow nozzle are arranged next to said injection hole of said blast gun positioned at least one side of an orthogonal direction to said moving direction of said workpiece with respect to said injection hole of said blast gun, and said suction device is faced toward said leading end of said blast gun from a front side of said diffusing direction of said inductive gas flow.

14. The blasting apparatus according to claim 12 wherein an opposing negative pressure space having an opposing suction device and an opening are provided on an opposite side to said surface to be processed of said workpiece respectively so as to be symmetrical to said negative pressure space, whereby a cut scrap and an abrasive are sucked and recovered from said negative pressure space and/or said opposing negative pressure space, by said opposing suction device.

15. The blasting apparatus according to claim 12, wherein said injection hole of said blast gun is formed as an elongated rectangular cross sectional shape and said injection hole is disposed at a position proximity to said workpiece so that said injecting direction is substantially vertical to said workpiece, and said suction device facing to said negative pressure space is provided at both sides in a width direction of said opening of said injection hole.

16. The blasting apparatus according to claim 15, wherein a width direction of said injection hole is aligned with said relative moving direction of said workpiece.

17. The blasting apparatus according to claim 15, wherein a width of said opening of said injection hole of said blast gun is within 0.1 mm to 100 mm.

18. The blasting apparatus according to claim 12, wherein an axial direction of said suction device facing to said negative pressure space with respect to said surface to be processed of said workpiece is set to an inclination angle within 10 to 80 degree.

19. The blasting apparatus according to claim 12, wherein a rectifying plate is provided within said opening of said negative pressure space at both sides of said injection hole of the same direction with said relative moving direction of said workpiece, and inclined so as to put distance from said workpiece as far from said injection hole in its width direction.

20. The blasting apparatus according to claim 13, wherein said negative pressure space is defined into at least two chambers having said suction device by providing two partition plates in said negative pressure space, both lower ends of said two partition plates are arranged at said leading end of said blast gun, and both upper ends of said two partition plate are directed to an upper portion of said suction device.

21. The blasting apparatus according to claim 20, wherein a minute interval is formed between said injection hole of said blow nozzle and an outer periphery of a leading end of said partition plate to which said injection hole of said blow nozzle is faced.

22. The blasting method according to claim 1, wherein
said workpiece to be processed is a thin-film solar cell panel having thin film layers which are a back electrode, a light absorbing layer, an emitter, a transparent electrode, required for a thin-film solar cell, on a glass substrate, and
said thin film layers and said abrasive cut and removed from said glass substrate are sucked and recovered from said negative pressure space or said opposing negative pressure space.

23. The blasting method according to claim 1, wherein said workpiece to be processed is a thin-film solar cell panel having thin film layers which are a back electrode, a light absorbing layer, an emitter, a transparent electrode, required for a thin-film solar cell, on glass substrate, and
said thin film layers and said abrasive cut and removed from said glass substrate are sucked and recovered from said negative pressure space or said opposing negative pressure space at a time of dividing said panel into each cell.

24. The blasting apparatus according to claim 12, wherein said workpiece to be processed is a thin-film solar cell panel having thin film layers which are a back electrode, a light absorbing layer, an emitter, a transparent electrode, required for a thin-film solar cell, on a glass substrate, and
said thin film layers and said abrasive cut and removed from said glass substrate are sucked and recovered from said negative pressure space or said opposing negative pressure space.

25. The blasting apparatus according to claim 12, wherein said workpiece to be processed is a thin-film solar cell panel having thin film layers which are a back electrode, a light absorbing layer, an emitter, a transparent electrode, required for a thin-film solar cell, on a glass substrate, and
said thin film layers and said abrasive cut and removed from said glass substrate are sucked and recovered from said negative pressure space or said opposing negative pressure space at a time of dividing said panel into each cell.

26. The thin-film solar cell panel processed by said blasting method according to claim 22, wherein said thin-film layers and said abrasive cut and removed from said glass substrate are sucked and recovered.

* * * * *